US010167362B2

(12) United States Patent
Lee et al.

(10) Patent No.: US 10,167,362 B2
(45) Date of Patent: Jan. 1, 2019

(54) DOPING-INDUCED CARRIER DENSITY MODULATION IN POLYMER FIELD-EFFECT TRANSISTORS

(71) Applicant: The Regents of the University of California, Oakland, CA (US)

(72) Inventors: Byoung Hoon Lee, Goleta, CA (US); Alan J. Heeger, Santa Barbara, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/256,160

(22) Filed: Sep. 2, 2016

(65) Prior Publication Data

US 2017/0069859 A1  Mar. 9, 2017

Related U.S. Application Data

(60) Provisional application No. 62/214,076, filed on Sep. 3, 2015.

(51) Int. Cl.
*C08G 61/12* (2006.01)
*H01L 51/00* (2006.01)
*H01L 51/05* (2006.01)

(52) U.S. Cl.
CPC ........ *C08G 61/126* (2013.01); *H01L 51/0036* (2013.01); *H01L 51/0043* (2013.01);
(Continued)

(58) Field of Classification Search
CPC .............. C08G 61/126; C08G 2261/92; H01L 51/0036; H01L 51/0043; H01L 51/0512; H01L 51/0545
See application file for complete search history.

(56) References Cited

U.S. PATENT DOCUMENTS 9,040,400 B2 * 5/2015 Wei ........................ B82Y 10/00
257/E21.135
9,605,102 B2   3/2017 Xiao et al.
(Continued)

FOREIGN PATENT DOCUMENTS

WO   2014039847   3/2014
WO   2015013747   2/2015

OTHER PUBLICATIONS

Bao, Z., et al., Organic Field-Effect Transistors, CRC Press, 2007.
(Continued)

*Primary Examiner* — Allan R Wilson
(74) *Attorney, Agent, or Firm* — Gates & Cooper LLP

(57) ABSTRACT

A method of fabricating an organic field effect transistor (OFET), including forming a source contact, a drain contact, and a gate connection to a channel comprising semiconducting polymers, wherein the gate connection applies a field to the semiconductor polymers across a dielectric layer to modulate conduction along the semiconducting polymers between the source contact and the drain contact; and treating the semiconducting polymers, wherein the treating includes a chemical treatment that controls a carrier density, carrier mobility, threshold voltage, and/or contact resistance of the OFET.

29 Claims, 5 Drawing Sheets

(52) U.S. Cl.
CPC .............. *C08G 2261/124* (2013.01); *C08G 2261/146* (2013.01); *C08G 2261/1412* (2013.01); *C08G 2261/1646* (2013.01); *C08G 2261/18* (2013.01); *C08G 2261/212* (2013.01); *C08G 2261/228* (2013.01); *C08G 2261/3241* (2013.01); *C08G 2261/3246* (2013.01); *C08G 2261/51* (2013.01); *C08G 2261/92* (2013.01); *H01L 51/0512* (2013.01); *H01L 51/0545* (2013.01)

(56) References Cited

U.S. PATENT DOCUMENTS

| | | | |
|---|---|---|---|
| 2005/0208400 A1* | 9/2005 | Nishikawa | B82Y 10/00 430/57.8 |
| 2015/0194606 A1 | 7/2015 | Luo et al. | |
| 2016/0064671 A1* | 3/2016 | Kleeman | H01L 51/0023 257/40 |
| 2017/0133597 A1* | 5/2017 | Lee | H01L 51/0036 |

OTHER PUBLICATIONS

Caironi, M., et al., Large Area and Flexible Electronics, John Wiley & Sons, 2015.

Lu, G., et al., "Moderate doping leads to high performance of semiconductor/insulator polymer blend transistors", Nature Communications, 2013, pp. 1-8, vol. 4, No. 1588.

Pernstich, K.P., et al., "Threshold Voltage Shift in Organic Field Effect Transistors by Dipole-Monolayers on the Gate Insulator", J. Appl. Physics, 2004, pp. 1-9, vol. 96, No. 6431.

Lussem, B., et al., "Doped organic transistors operating in the inversion and depletion regime", Nature Communications, 2013, pp. 1-6, vol. 4, No. 2775.

Tseng, H-R., et al., "High Mobility Field Effect Transistors Based on Macroscopically Oriented Regioregular Copolymers", Nano Letters, 2012, pp. 6353-6357, vol. 12.

Tseng, H-R., et al., "High-Mobility Field-Effect Transistors Fabricated with Macroscopic Aligned Semiconducting Polymers", Advanced Materials—Materials Views, 2014, pp. 2993-2998, vol. 26, No. 19.

Kislyuk, V.V., et al., "In-situ conductivity and UV-VIS absorption monitoring of iodine doping-dedoping processes in poly(3-hexylthiophene) (P3HT)", Journal of Physics: Conference Series—Condensed Matter and Materials Physics Conference (CMMP10), 2011, pp. 1-10, vol. 286.

Hwang, J., et al., "In situ measurements of the optical absorption of dioxythiophene-based conjugated polymers", Physical Review B, 2011, pp. 195121-1-195121-12, vol. 83.

Ying, L., et al., "Regioregular Pyridal[2,1,3]thiadiazole π-Conjugated Copolymers", Journal of the American Chemical Society, 2011, pp. 18538-18541, vol. 133.

Schaur, S., et al., "Electrochemical doping for lowering contact barriers in organic field effect transistors", Organic Electronics, 2012, pp. 1296-1301, vol. 13.

Dibenedetto, S.A., et al., "Molecular Self-Assembled Monolayers and Multilayers for Organic and Unconventional Inorganic Thin-Film Transistor Applications", Advanced Materials, 2009, pp. 1407-1433, vol. 21.

Lee, Byoung Hoon et al., "Doping-Induced Carrier Density Modulation in Polymer Field-Effect Transistors", Advanced Materials 2016, 28, pp. 57-62.

Lee, Byoung Hoon et al., "Doping-induced carrier density modulation in polymer field-effect transistors", Advanced Materials Supporting Information, DOI: 10-1002/adma.201504307, 2016, pp. S1-S12.

Braga et al.,"High-Performance Organic Field-Effect Transistors". Adv. Mater. 2009, 21, pp. 1473-1486.

Luo et al., "General Strategy for Self-Assembly of Highly Oriented Nanocrystalline Semiconducting Polymers with High Mobility". Nano Lett. 2014, 14, pp. 2764-2771.

Kobayashi et al., "Control of carrier density by self-assembled monolayers in organic field-effect transistors". Nat. Mater. 2004, 3, pp. 317-322.

Kim et al., "Remarkable Mobility Increase and Threshold Voltage Reduction in Organic Field-Effect Transistors by Overlaying Discontinuous Nano-Patches of Charge-Transfer Doping Layer on Top of Semiconducting Film". Adv. Mater. 2013, 25, pp. 719-724.

Kim et al., "A Thienoisoindigo-Naphthalene Polymer with Ultrahigh Mobility of 14.4 cm2/V-s That Substantially Exceeds Benchmark Values for Amorphous Silicon Semiconductors". J. Am. Chem. Soc. 2014, 136, pp. 9477-9483.

Lee et al., "Novel Film-Casting Method for High-Performance Flexible Polymer Electrodes". Adv. Funct. Mater. 2011, 21, pp. 487-493.

Chiang et al., "Electrical Conductivity in Doped Polyacetylene". Phys. Rev. Lett. 1977, 39, pp. 1098-1101.

Wang, "Stability of poly(3-dodecylthiophene) upon doping and thermal de-doping". Polym. Degrad. Stab. 2005, 89, pp. 15-20.

Marinkovik et al., "On the Origin of Contact Resistances of Organic Thin Film Transistors". Adv. Mater. 2012, 24, pp. 4005-4009.

Cho et al., "Enhanced Performance of Fullerene n-Channel Field-Effect Transistors with Titanium Sub-Oxide Injection Layer". Adv. Funct. Mater. 2009, 19, pp. 1459-1464.

Abdou et al., "Interaction of Oxygen with Conjugated Polymers: Charge Transfer Complex Formation with Poly(3-alkylthiophenes)". J. Am. Chem. Soc. 1997, 119, pp. 4518-4524.

Zaumseil et al., "Contact resistance in organic transistors that use source and drain electrodes formed by soft contact lamination". J. Appl. Phys. 2003, 93, pp. 6117-6124.

Van Der Poll et al., "Non-Basic High-Performance Molecules for Solution-Processed Organic Solar Cells". Adv. Mater. 2012, 24, pp. 3646-3649.

Kalita et al., "Iodine doping in solid precursor-based CVD growth graphene film". J. Mater. Chem. 2011, 21, pp. 1520915213.

Wang et al., "Fluorine substitution influence on benzo[2,1,3]thiadiazole based polymers for field-effect transistor applications† ". Chem. Commun., 2016, 52, pp. 3207-3210.

Tseng et al. "High Mobility Field Effect Transistors Based on Macroscopically Oriented, Regioregular Copolymers", Nano Letters, vol. 12, iss. 12, pp. 6353-6357, 2012.

Tseng et al. "High Mobility Field Effect Transistors Fabricated with Macroscopic Aligned Semiconducting Polymers", Advanced Materials, pp. 1-6, 2014.

Zhang et al., "Significant Improved Performance of Photovoltaic Cells Made from a Partially Fluorinated Cyclopentadithiophene/Benzothiadiazole Conjugated Polymer". Macromolecules, 2012, 45, pp. 5427-5435.

Ying et al., "Regioregular Pyridal[2, 1,3]thiadiazole π-Conjugated Copolymers". J. Am. Chem. Soc., 2011, 133, pp. 18538-18541.

* cited by examiner

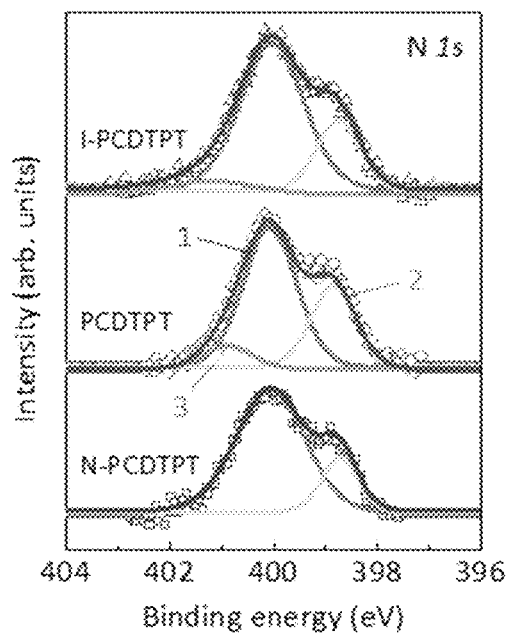
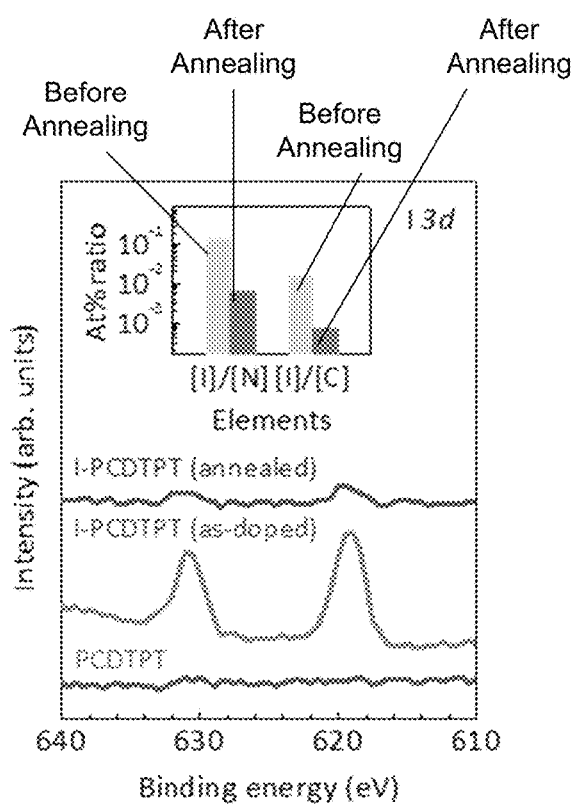
*Figure 4(a)*     *Figure 4(b)*

DOPING-INDUCED CARRIER DENSITY MODULATION IN POLYMER FIELD-EFFECT TRANSISTORS

CROSS REFERENCE TO RELATED APPLICATIONS

This application claims the benefit under 35 U.S.C. Section 119(e) of and commonly-assigned U.S. Provisional Patent Application No. 62/214,076, filed Sep. 3, 2015, by Byoung Hoon Lee and Alan J. Heeger, entitled "DOPING-INDUCED CARRIER DENSITY MODULATION IN POLYMER FIELD-EFFECT TRANSISTORS," which application is incorporated by reference herein.

This application is related to the following and commonly-assigned U.S. patent applications:

U.S. Provisional Patent Application No. 62/367,401, filed Jul. 27, 2016, by Colin R. Bridges, Michael J. Ford, Guillermo C. Bazan, and Rachel A. Segalman, entitled "FORMATION AND STRUCTURE OF LYOTROPIC LIQUID CRYSTALLINE MESOPHASES IN DONOR-ACCEPTOR SEMICONDUCTING POLYMERS,"

U.S. Provisional Patent Application No. 62/338,866, filed May 19, 2016, by Michael J. Ford, Hengbin Wang, and Guillermo Bazan, entitled "ORGANIC SEMICONDUCTOR SOLUTION BLENDS FOR SWITCHING AMBIPOLAR TRANSPORT TO N-TYPE TRANSPORT,"

U.S. Provisional Patent Application No. 62/327,311, filed Apr. 25, 2016, by Guillermo Bazan and Ming Wang, entitled "NOVEL WEAK DONOR-ACCEPTOR CONJUGATED COPOLYMERS FOR FIELD-EFFECT TRANSISTOR APPLICATIONS,";

U.S. Provisional Patent Application No. 62/276,145, filed Jan. 7, 2016, by Michael J. Ford and Guillermo Bazan, entitled "STABLE ORGANIC FIELD-EFFECT TRANSISTORS BY INCORPORATING AN ELECTRON-ACCEPTING MOLECULE,"

U.S. Provisional Patent Application No. 62/253,975, filed Nov. 11, 2015, by Ming Wang and Guillermo Bazan, entitled "FLUORINE SUBSTITUTION INFLUENCE ON BENZO[2,1,3]THIODIAZOLE BASED POLYMERS FOR FIELD-EFFECT TRANSISTOR APPLICATIONS,"

U.S. Provisional Patent Application No. 62/263,058, filed Dec. 4, 2015, by Byoung Hoon Lee, Ben B. Y. Hsu, Chan Luo, Ming Wang, Guillermo Bazan, and Alan J. Heeger, entitled "SEMICONDUCTING POLYMERS WITH MOBILITY APPROACHING ONE HUNDRED SQUARE CENTIMETERS PER VOLT PER SECOND,"

U.S. Utility application Ser. No. 15/213,029 filed on Jul. 18, 2016 by Byoung Hoon Lee and Alan J. Heeger, entitled "FLEXIBLE ORGANIC TRANSISTORS WITH CONTROLLED NANOMORPHOLOGY", which application claims the benefit under 35 U.S.C. Section 119(e) of U.S. Utility U.S. Provisional Application Ser. No. 62/193,909 filed on Jul. 17, 2015 by Byoung Hoon Lee and Alan J. Heeger, entitled "FLEXIBLE ORGANIC TRANSISTORS WITH CONTROLLED NANOMORPHOLOGY", U.S. Utility patent application Ser. No. 15/058,994, filed Mar. 2, 2016, by Shrayesh N. Patel, Edward J. Kramer, Michael L. Chabinyc, Chan Luo and Alan J. Heeger, entitled "BLADE COATING ON NANOGROOVED SUBSTRATES YIELDING ALIGNED THIN FILMS OF HIGH MOBILITY SEMICONDUCTING POLYMERS," which Application claims the benefit under 35 U.S.C. Section 119(e) of U.S. Provisional Patent Application No. 62/127,116, filed Mar. 2, 2015, by Shrayesh N. Patel, Edward J. Kramer, Michael L. Chabinyc, Chan Luo and Alan J. Heeger, entitled "BLADE COATING ON NANOGROOVED SUBSTRATES YIELDING ALIGNED THIN FILMS OF HIGH MOBILITY SEMICONDUCTING POLYMERS,"

U.S. Utility patent application Ser. No. 14/585,653, filed on Dec. 30, 2014, by Chan Luo and Alan Heeger, entitled "HIGH MOBILITY POLYMER THIN FILM TRANSISTORS WITH CAPILLARITY MEDIATED SELF-ASSEMBLY", which application claims the benefit under 35 U.S.C. Section 119(e) of U.S. Provisional Patent Application Ser. No. 61/923,452, filed on Jan. 3, 2014, entitled "HIGH MOBILITY POLYMER THIN FILM TRANSISTORS WITH CAPILLARITY MEDIATED SELF-ASSEMBLY,"

U.S. Utility patent application Ser. No. 14/426,467, filed on Mar. 6, 2015, by Hsing-Rong Tseng, Lei Ying, Ben B. Y. Hsu, Christopher J. Takacs, and Guillermo C. Bazan, entitled "FIELD-EFFECT TRANSISTORS BASED ON MACROSCOPICALLY ORIENTED POLYMERS," which application claims the benefit under 35 U.S.C. § 365 of PCT International patent application serial no. PCT/US13/058546 filed Sep. 6, 2013, which application claims the benefit under 35 U.S.C. Section 119(e) of U.S. Provisional Patent Application Ser. Nos. 61/698,065, filed on Sep. 7, 2012, and 61/863,255, filed on Aug. 7, 2013, entitled "FIELD-EFFECT TRANSISTORS BASED ON MACROSCOPICALLY ORIENTED POLYMERS," (UC REF 2013-030); and U.S. Utility patent application Ser. No. 13/526,371, filed on Jun. 18, 2012, by G. Bazan, L. Ying, B. Hsu, W. Wen, H-R Tseng, and G. Welch entitled "REGIOREGULAR PYRIDAL[2,1,3]THIADIAZOLE PI-CONJUGATED COPOLYMERS FOR ORGANIC SEMICONDUCTORS", which application claims priority under 35 U.S.C. § 119(e) to U.S. Provisional Patent Application Ser. No. 61/498,390, filed on Jun. 17, 2011, by G. Bazan, L. Ying, B. Hsu, and G. Welch entitled "REGIOREGULAR CONSTRUCTIONS FOR THE SYNTHESIS OF THIADIAZOLO (3,4) PYRIDINE CONTAINING NARROW BAND GAP CONJUGATED POLYMERS" and U.S. Provisional Patent Application Ser. No. 61/645,970, filed on May 11, 2012, by G. Bazan, L. Ying, and Wen, entitled "REGIOREGULAR PYRIDAL[2,1,3]THIADIAZOLE PI-CONJUGATED COPOLYMERS FOR ORGANIC SEMICONDUCTORS";

all of which applications are incorporated by reference herein.

STATEMENT REGARDING FEDERALLY SPONSORED RESEARCH AND DEVELOPMENT

This invention was made with Government support under Grant Nos. DMR 0856060 and DMR 1436263 awarded by the National Science Foundation to Alan J. Heeger.

BACKGROUND OF THE INVENTION

1. Field of the Invention

This invention relates to a method and device for controlling carrier density and contact resistance in an Organic Field Effect Transistor (OFET) or Organic Thin Film Transistor (OTFT).

2. Description of the Related Art (Note: This application references a number of different publications as indicated throughout the specification by one or more reference numbers in superscripts. A list of these different publications ordered according to these reference numbers can be found below in the section entitled "References." Each of these publications is incorporated by reference herein.)

Solution-processed organic field-effect transistors (OFETs) based on semiconducting polymers as charge transport layers continue to attract considerable attention in both academic and industrial communities, due to their potential for mass production of flexible and cost-effective "Plastic Electronics"[1-3]. In particular, carrier mobilities have been remarkably increased over the past decades, exceeding 50 cm$^2$ V$^{-1}$s$^{-1}$ (and even higher) [4]. Despite such high mobility, however, OFETs have received less attention for practical applications due to unstable device characteristics— organic semiconductors can be doped unintentionally, and thus devices often operate in the depletion mode [5, 6]. More seriously, undesired doping makes the carrier density uncontrollable, thereby leading to variable (uncontrollable) threshold voltage ($V_T$), increased off-current (causing decreased on/off ratio), and variable carrier mobility [7]. Since constructing useful circuits requires the precise control of carrier density, one must understand how semiconducting polymers can be doped during the device fabrication process, and one must develop a facile method to achieve desired carrier density for ensuring proper operation of plastic electronic circuits.

Previous effort to control carrier density of OFETs focused mainly on surface modification of the gate dielectrics using self-assembled monolayers (SAMs) [5, 8]. By passivating the gate dielectric surface (most often silicon dioxide; SiO$_2$) with various SAM molecules bearing different functional end groups, the carrier density and $V_T$ were varied by varying degrees of the dipole-induced built-in electric field. More recent reports describe alternative approaches by charge transfer doping of organic transport layers [9] and by introducing doped organic thin films between the dielectric and organic transport layer [10]. Although carrier density and $V_T$ were effectively controlled, these methodologies can affect the nanomorphology and resistivity of the organic semiconductors on which carrier mobility strongly depends [3]. Therefore, a reliable and facile method for controlling carrier density, while maintaining (or even increasing) the mobility of solution-processed OFETs, but without changing device configuration, needs to be developed. One or more embodiments of the present invention satisfy this need.

SUMMARY OF THE INVENTION

One or more embodiments of the present invention disclose high-mobility polymer transistors with surprisingly controlled device properties, including carrier density, threshold voltage, contact resistance, and mobility, by modest doping and charge compensation and/or selection of the semiconducting polymers in the transistor channel.

1. In one or more embodiments, the semiconducting polymer is a donor acceptor semiconducting polymer such as, but not limited to, PCDTPT or a semiconducting polymer having a repeating unit of the structure:

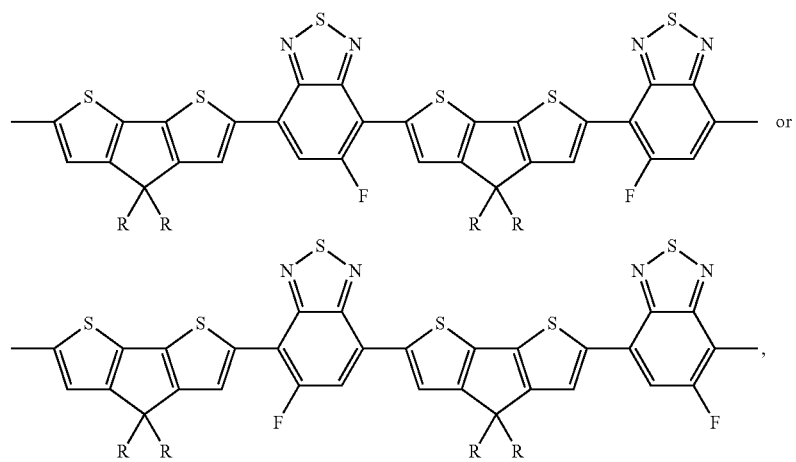

wherein the fluorine (F) is regioregularly arranged along the semiconducting polymer's conjugated main chain section and the R are each independently selected from an alkyl, aryl, or an alkoxy chain.

2. In any of the preceding embodiments, through fleeting chemical vapor treatments of aligned polymer (e.g., PCDTPT) thin films as the charge transport layer in the FET channel, the FET properties can be tailored by controlling the doping concentration of the PCDTPT adjacent to metal electrodes.

3. In any of the preceding embodiments 1-2, the semiconducting polymers that interface with the source contact and drain contacts are doped with one or more doping levels/concentrations that (1) increase linearity of the OFET's current-voltage (IV) curve, for voltages applied between the source contact and the drain contact in a range of 0 and +/−5 V but (2) do not change the channel's resistance, defined as $R_S/W$, to within 2% or within 4% (for example) as compared to before the doping, where $R_S$ is the channel's series resistance and W is the channel's width.

4. In any of the preceding embodiments 1-3, the semiconducting polymers are charge compensated.

5. In any of the preceding embodiments 1-4, the semiconducting polymers can be subjected to one or more chemical treatments, e.g. to achieve the doping and/or charge compensation.

6. In any of the preceding embodiments 1-5, the doping levels/chemical treatment can be such that 1% or less than 1% of monomers in the semiconducting polymers are doped.

7. In any of the preceding embodiments 1-6, the doping levels/chemical treatments can be such that the OFET has a threshold voltage within +/−2 Volts of 0 Volts.

8. In any of the preceding embodiments 1-7, the doping levels/chemical treatments can shift the threshold voltage to a more positive bias and reduce variability of the threshold voltage, as compared to without doping.

9. In any of the preceding embodiments 1-8, the doping levels/chemical treatments can be such that the OFET's on/off ratio remains the same or is increased and the OFET's off current remains the same or is decreased, as compared to without doping.

10. In any of the preceding embodiments 1-9, the doping levels/chemical treatments can be such that the OFET's contact resistance is reduced by at least a factor of two as compared to without doping.

11. In any of the preceding embodiments 1-10, the doping levels/chemical treatments are characterized by an increase in absorption of the channel, at a wavelength in a range of 800 nm-1100 nm, of less than 0.5% as compared to without the doping (and/or such that normalized absorption at wavelengths between 1600 nm and 1900 nm is 0.01 or less).

12. In any of the preceding embodiments 11, the doping levels/chemical treatment increase the channel's carrier mobility to at least 58.6 $cm^2 V^{-1}s^{-1}$ in a saturation regime and at least 18.1 $cm^2 V^{-1}s^{-1}$ in a linear regime.

13. In any of the preceding embodiments 1-12, the chemical treatment/charge compensation comprises exposing the channel to a compound comprising an amine.

14. In any of the preceding embodiments 1-13, the chemical treatment/charge compensation comprises exposing the OFET to a compound comprising $NH_4OH$.

15. In any of the preceding embodiments 1-14, the chemical treatment/charge compensation comprises exposing the OFET to $RNH_2$, where R is hydrogen or a compound.

16. In any of the preceding embodiments 1-15, the chemical treatment comprises oxidizing the semiconducting polymer.

17. In any of the preceding embodiments 1-16, the doping/chemical treatment comprises exposing the OFET to $I_2$ vapor and annealing the OFET after the exposing.

18. In any of the preceding embodiments 1-17, the treating further comprises annealing the semiconductor polymers after the chemical treatment, and/or the annealing is such that hysteresis of the OFET's transfer curve is reduced and the channel's mobility is increased, while the OFET's threshold voltage is not changed to within 1%.

19. In any of the preceding embodiments 1-18, the semiconducting polymers comprising a conjugated main chain section, said conjugated main chain section having a repeat unit that comprises at least one acceptor structure selected from:

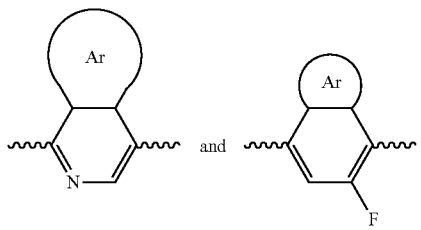

wherein Ar is a substituted or non-substituted aromatic functional group, or Ar is nothing and the valence of the pyridine ring is completed with hydrogen or the valence of the fluorobenzene ring is completed with hydrogen. Said acceptor structures can be regioregularly arranged along the conjugated main chain section.

20. In the embodiment 19, the pyridine unit comprising:

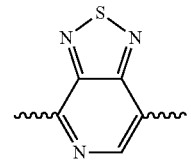

21. In the embodiment 20, the fluorinated unit comprising:

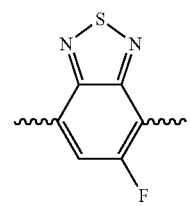

22. In the embodiments 19-21, the repeat unit further comprising a dithiophene of the structure:

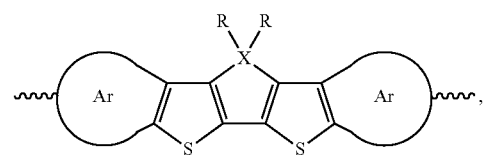

wherein each Ar is independently a substituted or non-substituted aromatic functional group, or each Ar is independently nothing and the valence of its respective thiophene ring is completed with hydrogen, each R is independently hydrogen or a substituted or non-substituted alkyl, aryl or alkoxy chain; and X is C, Si, Ge, N or P.

23. In the embodiment 19, the semiconducting polymer comprising a regioregular poly[4-(4,4-dihexadecyl-4H-cyclopenta[1,2-b:5,4-b']dithiophen-2-yl)-alt-[1,2,5]thiadiazolo[3,4-c]pyridine] (PCDTPT, abbreviation name P2).

24. In the embodiment 19, the semiconducting polymer comprising regioregular poly[4-(4,4-dihexadecyl-4H-cyclopenta[1,2-b: 5,4-b']dithiophen-2-yl)-6-fluorobenzo[c][1,2,5]thiadiazole] (PCDTFBT).

25. In the embodiment 19, the semiconducting polymer having the following structure:

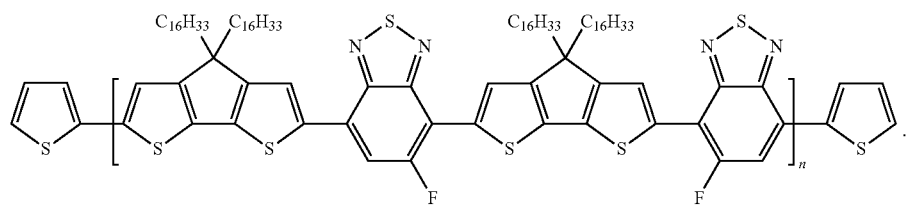

26. In any of the preceding embodiments 1-25, the semiconducting polymers each having their main chain axis aligned with an alignment direction in the channel pointing from the source contact to the drain contact, so that charge transport between the source contact and the drain contact is preferentially along the alignment direction.

27. In any of the preceding embodiments 1-26, the semiconducting polymers are oriented by one or more nanogrooves in the dielectric layer, the semiconducting polymers comprise polymer chains stacked into one or more fibers, one or more of the nanogrooves contact and align one or more of the fibers, and the nanogrooves provide a nucleation site for growth of the polymer chains so that one or more of the polymer chains seed within one or more of the nanogrooves.

BRIEF DESCRIPTION OF THE DRAWINGS

Referring now to the drawings in which like reference numbers represent corresponding parts throughout:

FIGS. 1(a)-1(c) illustrates material, device structure, and absorption spectra, wherein FIG. 1(a) illustrates molecular structure of PCDTPT, FIG. 1(b) illustrates a schematic device architecture with $n^{++}$ Si (500 μm)/n-$SiO_2$ (300 nm)/Ni (5 nm)/Au (50 nm)/n-decyltrichlorosilane/PCDTPT and chemical vapor treatments with $NH_3$ (g) and $I_2$ (g), according to one or more embodiments of the present invention, and FIG. 1(c) shows absorption spectra of N-PCDTPT, PCDTPT, and I-PCDTPT thin films.

FIGS. 4(a)-4(b) illustrate X-ray photoelectron spectroscopy (XPS) data for one or more embodiments of the present invention, wherein FIG. 4(a) shows N 1s spectra of the N-PCDTPT (red), PCDTPT (green), and I-PCDTPT (blue) thin films, wherein the numbers are displayed for peak assignment, and FIG. 4(b) shows I 3d spectra of the annealed PCDTPT thin film (green) as well as the I-PCDTPT thin film, before (grey) and after (blue) annealing.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

A. Introduction

Figure 1A:
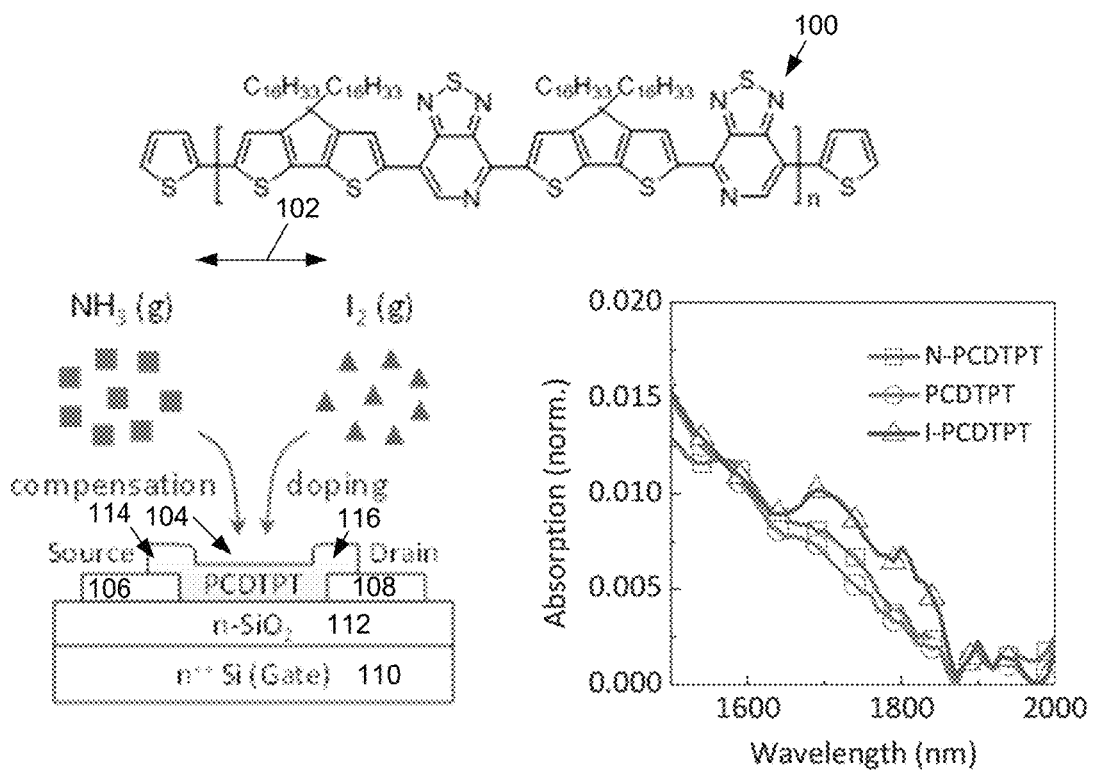

One or more embodiments of the present invention report the effect of impurities (dopants), introduced by chemical vapor treatment, on device properties (including carrier density, $V_T$, and mobility) of high-mobility OFETs containing a regioregular polymer, poly[4-(4,4-dihexadecyl-4H-cyclopenta[1,2-b:5,4'-b]ldithiophen-2-yl)-alt-[1,2,5]thiadiazolo-[3,4-c]pyridine] (PCDTPT; see FIG. 1(a) for the molecular structure) as the charge transport layer in the channel of the FET. By comparing device properties of aligned PCDTPT thin films with various chemical vapor treatments using ammonium hydroxide solution ($NH_4OH$ (aq)) and iodine ($I_2$), it was found that pristine PCDTPT has holes trapped near the metal/polymer interfaces generated by unintentional doping with, presumably, water or oxygen. As a result, one finds $V_T$ in the positive bias regime (approximately 7 V). The devices exposed to $NH_4OH$ vapor (for charge compensation) exhibited decreased carrier density (at zero gate bias) and shifted $V_T$ (shifted to approximately 0 V), while the device with $I_2$ vapor treatment (for doping) showed increased carrier density with positively-shifted $V_T$ (shifted to approximately 14 V). With gradually increased doping concentration, the hole mobility increases to values as high as 58.6 $cm^2$ $V^{-1}s^{-1}$ (18.1 $cm^2$ $V^{-1}s^{-1}$ in the linear regime), the highest value for semiconducting polymers reported to date [4,11,12]. The contact resistance is correspondingly reduced.

B. Example Structure

FIG. 1(a) illustrates a semiconducting polymer (PCDTPT) having a backbone 100, the backbone 100 having a main chain axis 102. In one or more embodiments, the semiconducting polymer is a derivative wherein the Nitrogen (N) in the pyridine is changed to a C-F functionality, e.g., PCDTFBT.

OFETs were constructed onto nano-grooved $SiO_2$ gate dielectrics [4, 11] on a substrate (n-$SiO_2$ on $n^{++}$ silicon (Si) substrates) for completing the bottom gate bottom contact (BGBC) geometry (see FIG. 1(b)).

FIG. 1(b) illustrates an OFET comprising a channel 104 including semiconducting polymers (e.g., PCDTPT); a source contact 106 to the semiconducting polymers in the channel 104; a drain contact 108 to the semiconducting polymers in the channel 104; a gate contact ($n^{++}$ silicon (Si)) 110 under the channel 104, and a dielectric (n-$SiO_2$) 112 between the semiconducting polymers and gate 110. Also illustrated is a first region 114 of the channel 104 comprising doped and/or charge compensated semiconducting polymers (e.g., I-PCDTPT and N-PCDTPT) that interface with the source contact 106; and a second region 116 of the channel 104 comprising doped and/or charge compensated semiconducting polymers (e.g., I-PCDTPT and N-PCDTPT) that interface with the drain contact 108. In one or more embodiments, the doped semiconducting polymers in each of the first and second regions 114, 116 have first and second dopant levels, respectively, wherein the first and second dopant levels/concentrations can be the same or different.

The semiconducting polymers (e.g., PCDTPT) each have their main chain axis 102 aligned with an alignment direction in the channel 104 pointing from the source contact 106 to the drain contact 108, so that charge transport between the source contact 106 and the drain contact 108 is preferentially along the semiconducting polymer's backbone 100 in the alignment direction 102.

As further discussed in the next section, the doping is formed by exposing the semiconducting polymers in the OFET to iodine gas ($I_2$ (g)) and the charge compensating is formed by exposing the semiconducting polymers to ammonia gas ($NH_3$ (g)).

C. Example Fabrication

The n-$SiO_2$ substrates were prepared by rubbing an n$^{++}$Si (500 µm)/$SiO_2$ (300 nm) substrate (International Wafer Services Co.) with a diamond lapping disc with particle sizes of 100 nm (Allied High Tech Products Inc.) as described in detail in the previous reports [4, 11]. The Ni (5 nm)/Au (50 nm) source and drain electrodes were patterned on the dielectrics through a conventional photolithography process. All metal electrodes were deposited by electron beam evaporation at 7×10$^{-7}$ Torr. After ultraviolet/ozone treatment of the pre-cleaned n-$SiO_2$ substrates for 10 min, the substrates were passivated with n-decyltrichlorosilane (Gelest Inc.) in toluene solution (1% by volume) at 80° C. for 20 min in air.

PCDTPT was cast on the pre-patterned source and drain electrodes on the nano-grooved $SiO_2$ substrates, utilizing the "sandwich" casting method for achieving uniaxial polymer alignment and high mobility [4, 11, 13]. Specifically, the PCDTPT (1-Material Inc.) was then cast from a chlorobenzene solution (0.25 mg mL$^{-1}$) for approximately 5 hours (h) through "sandwich" casting in a nitrogen-filled glove box [4].

The devices were then cured at 200° C. for 3 min prior to measurements, and were tested using a probe station (Signatone Co.) in a nitrogen-filled glove box. Data were collected by a Keithley 4200 system. For N-PCDTPT-devices, the tested device was exposed to $NH_4OH$ vapor (EMD Chemicals, Inc.) for 5 s in a nitrogen-filled glove box, and tested.

Transistor characteristics were first measured in a nitrogen-filled glove box after thermal annealing for enhanced device performance. Then, the PCDTPT thin film in the device channel was exposed to the vapor from $NH_4OH$ (aq) (henceforth referred to as N-PCDTPT) for 5 seconds (s) in a nitrogen-filled glove box. Ammonia ($NH_3$) is known to compensate positive charges in doped conjugated polymer systems [14]. The transistor characteristics were then re-measured. The PCDTPT thin film was subsequently exposed to $I_2$ vapor (henceforth referred to as I-PCDTPT), a strong dopant for most semiconducting conjugated polymers [15-17] (specifically, the device was exposed to $I_2$ vapor (Sigma Aldrich, Inc.) for 5 s in a nitrogen-filled glove box, The transistor characteristics were again collected before and after annealing at 200° C. for 1 min. The sequence of the chemical treatments (using $NH_4OH$ and $I_2$) does not affect resulting device performance, and the aforementioned effects are repetitively/repeatably reversible.

D. Example Characterization

1. Absorption

The ultraviolet-visible absorption spectra of N-PCDTPT, PCDTPT, and I-PCDTPT thin films were obtained by using an OLIS 14 UV/VIS/NIR spectrophotometer (On-Line Instrument Systems, Inc.). The samples were prepared by spin casting chlorobenzene solutions (5 mg mL$^{-1}$) at 600 revolutions per minute (rpm) for 60 seconds (s) on pre-cleaned fused silica substrates.

The ultraviolet-visible absorption spectra of PCDTPT thin films were measured first to investigate any changes in electronic structure of PCDTPT induced by chemical vapor treatments (FIG. 1(c)). The measured absorption spectra of N-PCDTPT, PCDTPT, and I-PCDTPT thin films taken in wavelength range of 300-2,000 nanometers (nm) appear to be almost identical, implying that doping concentration of PCDTPT (and even I-PCDTPT) is modest [18]. The onset of absorption occurs at approximately 1200 nm (1.02 eV) [19].

2. Transfer Curves

Figure 2A:
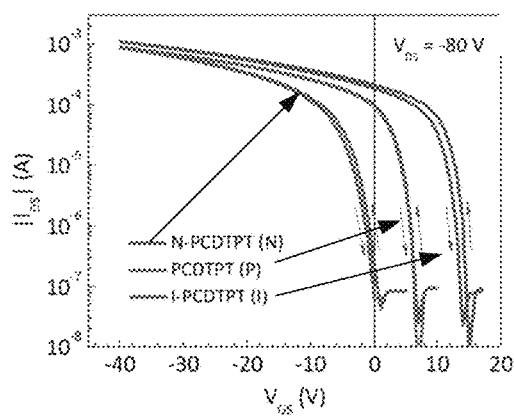
FIGS. 2(a)-2(b) illustrate transistor characteristics with various chemical vapor treatments according to one or more embodiments of the present invention, showing transfer curves of the devices with N-PCDTPT, PCDTPT, and I-PCDTPT taken at $V_{DS}$=−80 V (W/L=1,000/160 μm)
Figure 2B:
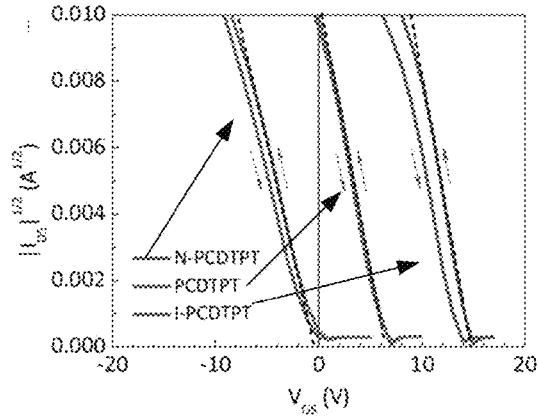
Figure 2C:
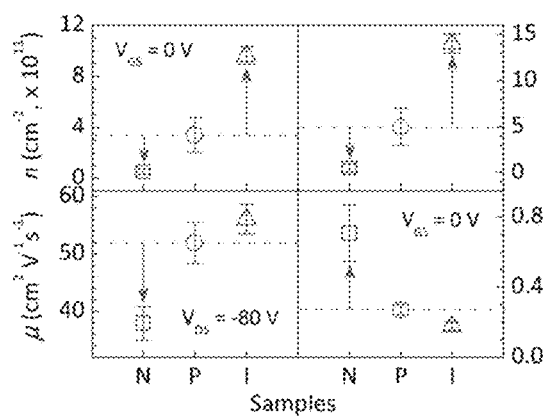
FIG. 2(c) shows extracted device parameters from the transfer and output curves of the devices with N-PCDTPT (N), PCDTPT (P), and I-PCDTPT (I) (see FIGS. 2(a)-2(b) and FIG. S3 in the Supporting Information[29]), and FIG. 2(d) plots $R_{tot}$ as a function of various L, wherein the lines denote linear fits of $R_{tot}$.

FIGS. 2(a)-2(c) displays transistor characteristics and extracted device parameters of OFETs with various chemical vapor treatments. Transfer curves of the devices with ammonia-compensated PCDTPT, PCDTPT, and I-PCDTPT are shown in FIGS. 2(a) and 2(b). All devices were fabricated on nano-grooved substrates. The field-effect mobilities in the saturation regime can be extracted from the following equation [20, 21]:

$$I_{DS}=(W/2L)C\mu(V_{GS}-V_T)^2 \quad (1)$$

where W is the channel width (1000 µm), L is the channel length (160 µm), C is the gate dielectric capacitance per unit area (11 nF cm$^{-2}$), µ is the carrier mobility in the saturation regime, $I_{DS}$ is the drain-source current, and $V_{GS}$ is the gate-source voltage. The threshold voltage, $V_T$, is defined as the intercept of a linear least square fit to $\sqrt{I_{DS}}$ versus $V_{GS}$, as displayed in FIG. 2(b).

Note that the output curves at high $V_{GS}$ are not saturated. Saturation and pinch-off are observed only in the low $V_{GS}$ regime (FIG. S3 in the Supporting Information [29]). Thus, one can obtain accurate mobilities using Eq. 1 only in the low $V_{GS}$ regime ($V_{GS}-V_T \leq -10$ V) [4, 11]. The device with pristine PCDTPT exhibited a mobility, µ=55.3 cm$^2$ V$^{-1}$s$^{-1}$, which is consistent with the previous report [4]. However, the $V_T$ is approximately 7 V, which indicates the presence of trapped holes in the channel. The carrier density (n) extracted from the relationship n≈$CV_{GS}$, where $V_{GS}$ is equivalent to the turn-on voltage ($V_{ON}$) of the device, is high (approximately 4.8×10$^{11}$ cm$^{-2}$) (FIG. 2(c)). The positive $V_T$ implies that electrons are injected to fill the traps, thereby freeing the holes to contribute to the channel current. Without being bound by a particular scientific theory, the inventors associate the doping with the lone-pair on the nitrogen atoms in the PCDTPT repeat unit.

To verify this hypothesis, the PCDTPT thin film was exposed to $NH_4OH$ for charge compensation. As seen by the transfer curves (FIGS. 2(a) and 2(b)) for the device with ammonia-compensated PCDTPT, the carrier density was reduced by nearly an order of magnitude at zero $V_{GS}$, to 6.8×10$^{10}$ cm$^{-2}$ (1 V was used as the $V_{ON}$ for the calculation). The corresponding $V_T \approx 0$ V is indicative of unipolar p-type transistors (normally-off devices). The mobility remains relatively high (µ=40.4 cm$^2$ V$^{-1}$s$^{-1}$, less than 27% decrease), demonstrating that device properties can be controlled by modest doping and charge compensation while maintaining high mobility.

The doping-induced performance manipulation proposed here was proved by further 'intentional' doping of N-PCDTPT thin films with $I_2$ vapor as a doping agent [15]. $I_2$-doping of PCDTPT also produced similar device properties, and this 'doping-charge compensation' process is repetitively/repeatably reversible. As seen by the transfer curves of I-PCDTPT devices (FIGS. 2(a) and 2(b)), $I_2$-vapor treatment leads to a positively-shifted $V_T$ of approximately 14 V. As a consequence of the shifted $V_T$, carrier density increased to 1.1×10$^{12}$ cm$^{-2}$ (FIG. 2(c)), which is significantly higher than that of the pristine device. Interestingly, the mobility of the I-PCDTPT-device, µ=58.6 cm$^2$ V$^{-1}$s$^{-1}$, is slightly higher than that of the PCDTPT device (µ=55.3 cm$^2$ V$^{-1}$s$^{-1}$). $V_T$ and µ values increase in the order of ammonia-compensated-PCDTPT<PCDTPT<I-PCDTPT, which is consistent with the increased doping concentration. The total resistance from source to drain contacts ($R_{tot}$), at zero $V_{GS}$, decreases by about a factor of 5 with the iodine doping (see FIG. 2(c)).

Note that the transfer curve and corresponding device parameters of the I-PCDTPT-FET were obtained by thermal annealing at 200° C. for 1 minute in a nitrogen-filled glove box (FIG. S4 in the Supporting Information [29]), which is not necessary for the ammonia-compensated PCDTPT device. Before annealing, low mobility ($\mu$=2.6 cm$^2$ V$^{-1}$s$^{-1}$) and large hysteresis were obtained, which are attributed to charge trapping by iodine impurities in the channel. Therefore, the high mobility and small hysteresis of the annealed I-PCDTPT-device could be explained by the removal of most of the iodine impurities from the channel area upon annealing at 200° C., which is the de-doping temperature for the iodine-doped conjugated polymers, e.g., poly(3-dodecylthiophene), P3DDT [17]. Despite such high mobility and low hysteresis, $V_T$ remained at approximately 14 V, almost identical to that of the as-doped I-PCDTPT-device (before annealing). Considering that $V_T$ and other device properties of ammonia-compensated PCDTPT and pristine PCDTPT are not changed by additional annealing, the inventors of the present invention speculate that iodine remains in the annealed I-PCDTPT thin film near the metal electrodes, and enables efficient hole injection at the metal/polymer interfaces. Since it is reasonable that NH$_4$OH interacts preferentially with doped PCDTPT, such high performance of the ammonia-compensated PCDTPT without annealing (i.e., impurity-removal process) guides the inventors' assumption.

3. Contact Resistance

Figure 2D:
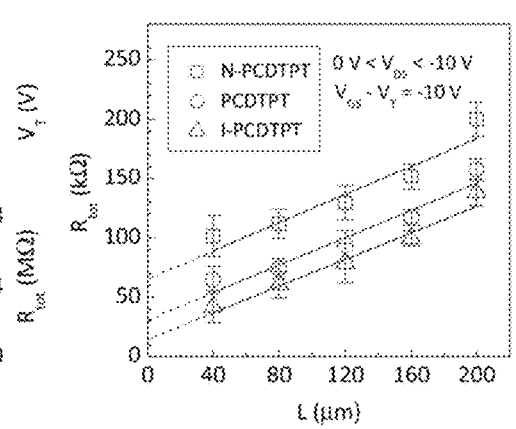

To verify enhanced hole injection at metal/polymer interfaces by doping, contact resistance $R_C$ values were extracted from $R_{tot}$ plots of devices with various L from 40 μm to 200 μm (FIG. 2(d)). $R_{tot}$ is the total resistance from source to drain contacts. Note that $R_{tot}$ values were extracted from the output curves in the range of 0 V<$V_{DS}$<−10 V taken at $V_{GS}$−$V_T$=−10 V. Using the following equation, $R_{tot}$=($R_S$/W) L+2Rc, where $R_S$ is the sheet resistance of the channel (polymer semiconductor), the total $R_C$ values of each device were obtained by extrapolating the measured $R_{tot}$ plots as a function of L[22]: 65.2 kiloOhms (kΩ) for ammonia-compensated PCDTPT, 30.9 kΩ for PCDTPT, and 14.7 kΩ for I-PCDTPT. The kinked $I_{DS}$-$V_{DS}$ (drain-source voltage) curve, which indicates high $R_C$, is indeed observed at low $V_{DS}$ (0<$V_{DS}$<−5 V) in the output curve of the PCDTPT-device (FIG. S6 in the Supporting Information [29]), and disappeared after intentional doping with I$_2$. Since the same device was for the $R_C$ measurement, the decreased $R_C$ values can be explained by enhanced hole injection as a result of a narrowed barrier width at the metal/polymer interfaces, accomplished by increased doping concentration in the sequence of N-PCDTPT<PCDTPT<I-PCDTPT [23]. The high $R_C$ for the PCDTPT-device is thought to result from disorder and non-alignment near the metal electrodes [21] due to interruption of PCDTPT solution flow by the metal electrodes during the film-forming process [4], and is decreased by modest doping at metal/polymer interfaces.

Slopes of the linear fits for all devices are almost identical (FIG. 2(d)): 0.59 kΩ μm$^{-1}$ for N-PCDTPT, 0.57 kΩ μm$^{-1}$ for PCDTPT, and 0.55 kΩ μm$^{-1}$ for I-PCDTPT. These results indicate that channel resistances ($R_S$/W) of the ammonia-compensated PCDTPT, PCDTPT, and I-PCDTPT thin films are almost identical, and thus imply that doping is preferentially in close proximity to the metal electrodes [24]. This is consistent with the almost identical off-current values as seen by the transfer curves shown in FIG. 2(a). Since doping of semiconducting polymers in OFETs is known to increase the off-current [6], the similar (and low) off-current values (approximately 10$^{-7}$ A) observed for all devices support the inventors' conclusion.

4. Mobility $R_C$ is also known to induce mismatch between μ and $\mu_{lin}$—$\mu_{lin}$ is usually lower than μ—because the linear regime is more strongly affected by voltage drop at metal/polymer interfaces than the saturation regime [25]. For this reason, $\mu_{lin}$ is more limited by $R_C$ and thus is lower than μ for devices with high $R_C$. This becomes a larger problem as L decreases, where $R_C$ is predominant [25]. Thus, it is important to understand the effect of $R_C$ on $\mu_{lin}$ to accomplish such high mobility for short-channel devices (e.g., a channel having a length of less than 50 micrometers and preferably less than 20 micrometers), which is useful for practical applications [4]. The $\mu_{lin}$ values were therefore extracted from the following equation [20, 21] $I_{DS}$=$\mu_{lin}$ C(W/L){($V_{GS}$−$V_T$)$V_{DS}$−($V_{DS}^2$/2)} using the output curves of the devices (FIGU. S3 in the Supporting Information [29]).

Figures 3A, 3B:
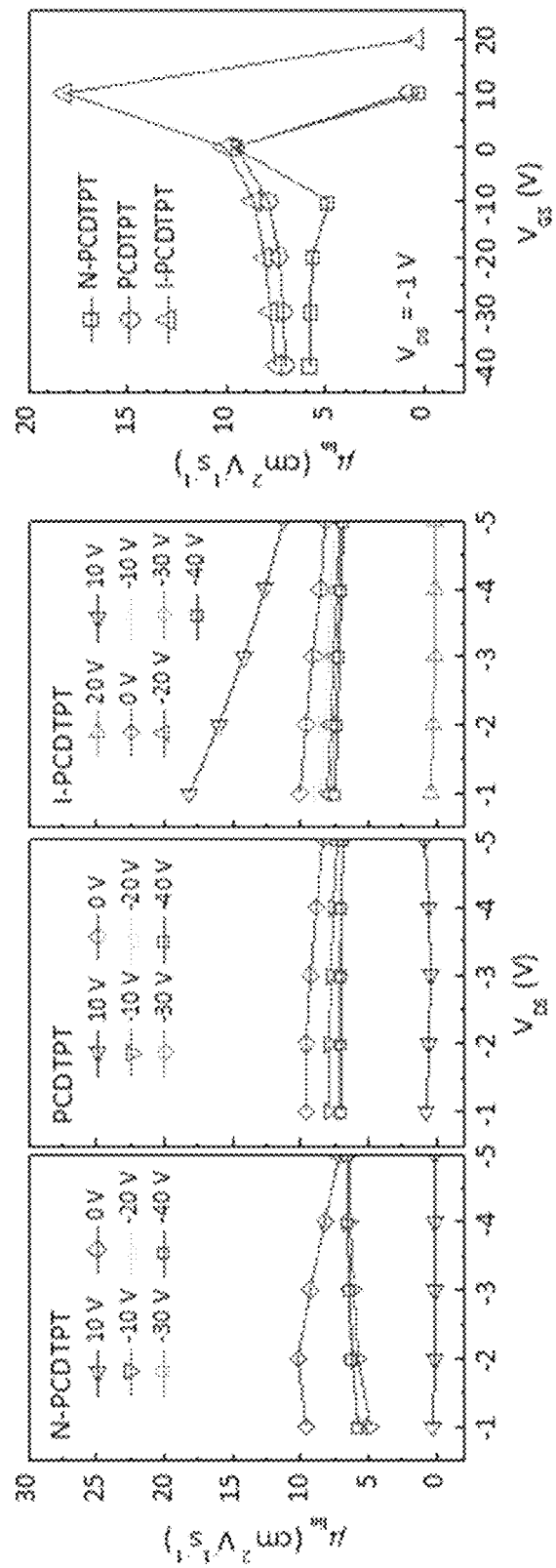
FIGS. 3(a)-3(b) illustrate linear mobilities ($\mu_{lin}$), the mobility in the linear non-saturated regime, wherein FIG. 3(a) plots $\mu_{lin}$ as a function of drain-source voltage ($V_{DS}$), for devices with N-PCDTPT, PCDTPT, and I-PCDTPT according to one or more embodiments of the present invention, taken at various gate-source voltages ($V_{GS}$), and FIG. 3(b) plots $\mu_{lin}$ as a function of $V_{GS}$ taken at $V_{DS}$=−1 V.

FIG. 3(a) displays extracted $\mu_{lin}$ plots as a function of $V_{DS}$ from −1 V to −5 V, taken at various $V_{GS}$. For a comparison, the $\mu_{lin}$ values are plotted as a function of $V_{GS}$ (taken at $V_{DS}$=−1 V) as shown in FIG. 3(b). The higher $\mu_{lin}$ is observed in the same order of N-PCDTPT<PCDTPT<I-PCDTPT described above, where the highest value ($\mu_{lin}$=18.1 cm$^2$ V$^{-1}$s$^{-1}$) is obtained at the highest doping concentration (for the I-PCDTPT-device). The $\mu_{lin}$/μ value (approximately 0.30) of the I-PCDTPT-device is higher than that ($\mu_{lin}$/μ=0.17) of the PCDTPT-device. Although measured $\mu_{lin}$ values are still lower than μ values, these results demonstrate that $\mu_{lin}$ can be increased by reducing $R_C$ through modest doping at metal/organic interfaces.

5. XPS Measurements

To explore the effect of doping and charge compensation on the electronic structure of PCDTPT, XPS measurements were carried out on the N-PCDTPT, PCDTPT, and I-PCDTPT (before and after annealing) thin films.

The thin films for XPS measurement were prepared by sandwich casting on pre-cleaned Au substrates in a nitrogen-filled glove box, and kept in a metal holder with nitrogen. The sample holder was then transferred into XPS chamber for measurement. The XPS results were obtained using a Kratos Axis Ultra XPS system (Kratos Analytical Ltd.) at a base pressure of 1×10$^{-8}$ Torr using monochromatized Al Kα X-ray photons (hv=1486.6 eV). High-resolution XPS spectra (N 1s) were obtained at constant pass energy of 40 eV and a step size of 0.02 eV, while survey XPS spectra (I 3d) were taken at pass energy of 20 eV with a step size of 0.1 eV. Data analysis (curve fitting and atomic percentage ratio) was carried out with CasaXPS software.

FIG. 4(a) shows N 1s spectra for N-PCDTPT, PCDTPT, and (as-doped) I-PCDTPT. The spectral features can be resolved by fitting with mainly two distinct components; one (#1) centered at 399.9 eV and the other (#2) centered at 398.8 eV. The peak #1 originates from the core levels of nitrogen in thiadiazole, and the peak #2 originates from the core levels of nitrogen in pyridine [26]. Besides these two peaks, an additional peak (#3) centered at 401.0 eV, which originates from "oxidized" nitrogen core levels [26] is observed in the PCDTPT and I-PCDTPT spectra, while the N-PCDTPT thin film produced N 1s spectrum without such oxidized nitrogen peak. Comparing S 2p and C 1s spectra of the thin films (FIG. S7 in the Supporting Information [29]), which appear to be almost identical upon doping and charge compensation, the inventors of the present invention can therefore conclude that in our case the device performances of PCDTPT can be determined by oxidation and reduction of nitrogen in the pyridine units [27] through facile chemical vapor treatments.

The presence of iodine in the annealed I-PCDTPT thin film was also confirmed by comparing I 3d XPS spectra of I-PCDTPT thin films before and after annealing (FIG. 4(b)). The spectrum of the as-doped I-PCDTPT thin film showed two distinct peaks centered at 619.1 eV and 630.8 eV, which correspond to I $3d_{5/2}$ and I $3d_{3/2}$, respectively [26, 28]. Since the spectrum of the annealed I-PCDTPT thin film also showed two corresponding peaks, this result indicates that iodine remained in the I-PCDTPT thin film even after high temperature annealing (at 200° C.). Comparing atomic percentage ratio of iodine to nitrogen (inset in FIG. 4(b) and FIG. S8 in the Supporting Information [29]), a doping concentration of ca. 5% of PCDTPT monomers in the as-doped I-PCDTPT thin film is estimated. This value decreased to ca. 0.2% by the thermal annealing (200° C. for 1 minute (min)), which is denoted 'modest doping' above and in the following. However, since XPS resolution is approximately 10 nanometers (nm) in depth, which is much thicker than the transport channel in the devices (approximately 2 nm), further investigation is required for more accurate estimation of doping concentration.

As aforementioned, since 'unintentional' doping is thought to be induced by water or oxygen that inevitably remains on metal electrodes, and therefore such effect can be intensified in bottom contact devices [3], one or more embodiments of the present invention fabricated top contact devices and compared device properties with those of bottom contact devices. The top contact devices were fabricated by doctor blade casting (instead of the sandwich casting) to make PCDTPT films as thin as possible for achieving low series resistance, induced by transport through the direction perpendicular to the substrate. For reference, bottom contact devices were also fabricated by doctor blade casting. Transfer curves of both top contact and bottom contact devices are displayed in FIG. S9 in the Supporting Information [29]. Although the top contact device produced slightly lower mobility ($\mu$=23.6 cm$^2$ V$^{-1}$s$^{-1}$) compared with that ($\mu$=29.6 cm$^2$ V$^{-1}$s$^{-1}$) of the bottom contact devices, the top contact device produced relatively lower $V_T$ (~4 V), which is much closer to zero $V_{GS}$. However, series resistance could also be reduced for top contact devices using a chemical treatment. Moreover, other polymer molecular structures can also be used to increase mobility and reliability for short-channel devices.

Process Steps

Figure 5:
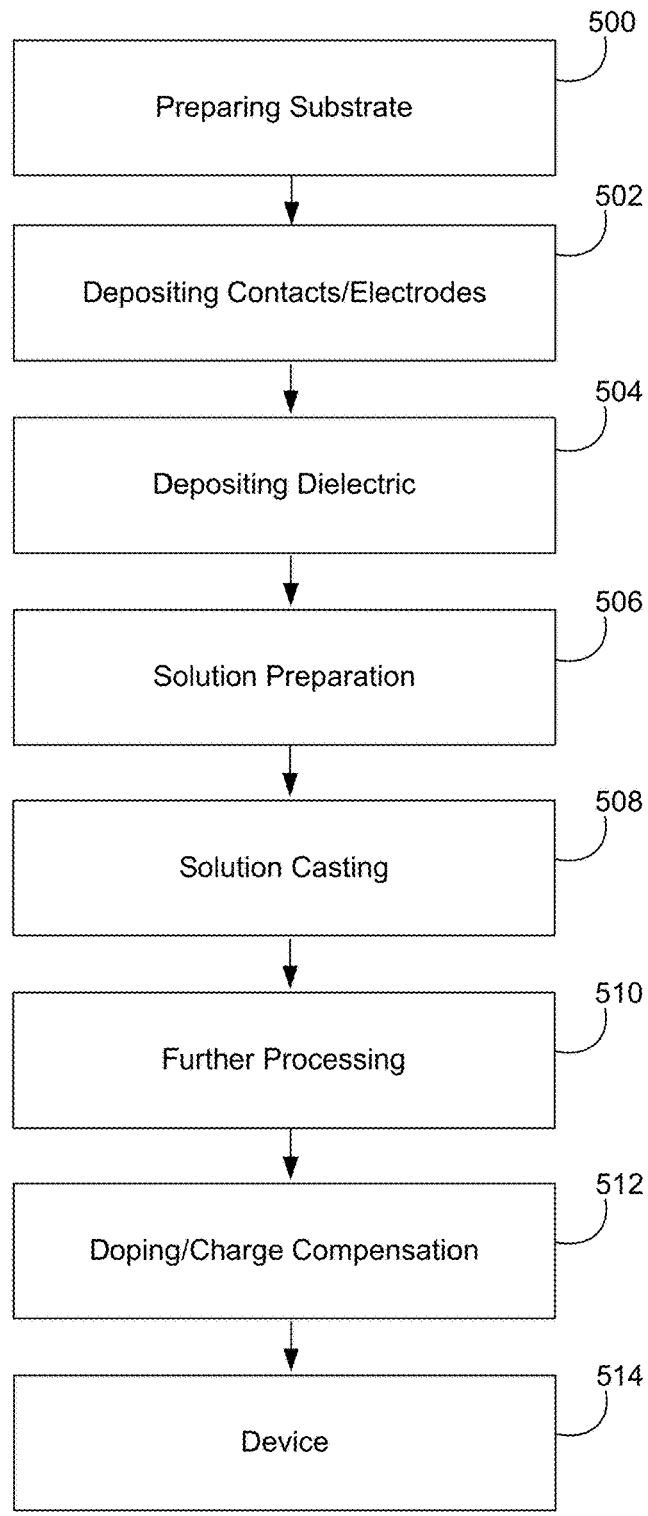
FIG. 5 illustrates a method of fabricating an OFET according to one or more embodiments of the present invention.

FIG. 5 is a flowchart illustrating a method for fabricating a device such as an OFET. The method comprises the following steps.

Block 500 represents obtaining/providing/preparing a substrate. In one or more embodiments, the substrate comprises a flexible substrate (e.g., a plastic, a polymer, a metal, or a glass substrate). In one or more embodiments, the flexible substrate is at least one film or foil selected from a polyimide film, a polyether ether ketone (PEEK) film, a polyethylene terephthalate (PET) film, a polyethylene naphthalate (PEN) film, a polytetrafluoroethylene (PTFE) film, a polyester film, a metal foil, a flexible glass film, and a hybrid glass film.

Block 502 represents optionally forming/depositing contacts or electrodes (e.g., p-type, n-type contacts, or a gate, or source and drain contacts) on or above (or as part of) the substrate.

In an OFET embodiment comprising a bottom contact geometry, source and drain contacts are deposited on the substrate. The source and drain contacts can comprise gold, silver, silver oxide, nickel, nickel oxide (NiOx), molybdenum, and/or molybdenum oxide, for example. The source and drain contacts of the OFET can further comprise a metal oxide electron blocking layer, wherein the metal can be, but is not limited to nickel, silver or molybdenum.

In an OFET embodiment comprising a bottom gate geometry, a gate electrode is deposited on the substrate. The gate contact (gate electrode) can be a thin metal layer, for example, an aluminum layer, a copper layer, a silver layer, a silver paste layer, a gold layer or a Ni/Au bilayer, or the gate contact can be a thin Indium Tin Oxide (ITO) layer, a thin fluorine doped tin oxide (FTO) layer, a thin graphene layer, a thin graphite layer, or a thin PEDOT:PSS layer. The thickness of the gate electrode may be adjusted (e.g., made sufficiently thin) depending on the flexibility requirement.

The gate, source, and drain contacts can be printed, thermal evaporated or sputtered.

Block 504 represents depositing a dielectric on the gate electrode, e.g., when fabricating an OFET in a bottom gate configuration. In this example, the dielectric is deposited on the gate contact's surface to form a gate dielectric. Further information on gate dielectrics can be found in Utility application Ser. No. 15/213,029 filed on Jul. 18, 2016 by Byoung Hoon Lee and Alan J. Heeger, entitled "FLEXIBLE ORGANIC TRANSISTORS WITH CONTROLLED NANOMORPHOLOGY".

Block 506 represents preparing or obtaining a solution comprising one or more semiconducting polymers.

In one or more embodiments, the semiconducting polymers include donor-acceptor semiconducting polymers known in the art or described in one or more of the references cross-referenced herein.

In one or more embodiments, the semiconducting polymers each comprise a (e.g., regioregular) conjugated main chain section, said conjugated main chain section having a repeat unit that comprises a pyridine of the structure:

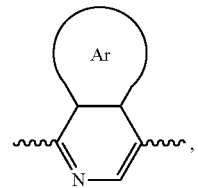

wherein Ar is a substituted or non-substituted aromatic functional group, or Ar is nothing and the valence of the pyridine ring is completed with hydrogen. In one or more embodiments, the pyridine is regioregularly arranged along the conjugated main chain section.

In one or more examples, the pyridine unit has the structure:

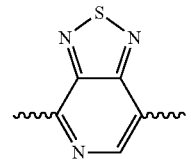

In one or more further embodiments, the repeat unit further comprises a dithiophene of the structure:

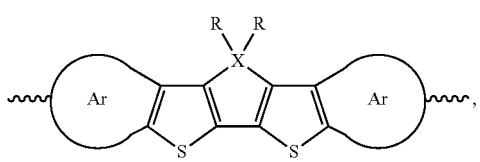

wherein the dithiophene is connected to the pyridine unit, each Ar is independently a substituted or non-substituted aromatic functional group or each Ar is independently nothing and the valence of its respective thiophene ring is completed with hydrogen, each R is independently hydrogen or a substituted or non-substituted alkyl, aryl or alkoxy chain; and X is C, Si, Ge, N or P. In some embodiments, the R groups can be the same. In the dithiophene, the R comprising the substituted or non-substituted alkyl, aryl or alkoxy chain can be a $C_6$-$C_{50}$ substituted or non-substituted alkyl or alkoxy chain, —$(CH_2CH_2O)n$ (n=2~30), $C_6H_5$, —$C_nF_{(2n+1)}$ (n=2~50), —$(CH_2)_nN(CH_3)_3Br$ (n=2~50), 2-ethylhexyl, $PhC_mH_{2m+1}$ (m=1-50), —$(CH_2)_nN(C_2H_5)_2$ (n=2~50), —$(CH_2)_nSi(C_mH_{2m+1})_3$ (m, n=1 to 50), or —$(CH_2)_nSi(OSI(C_mH_{2m+1})_3)_x(C_pH_{2p+1})_y$ (m, n, p=1 to 50, x+y=3).

Examples of dithiophene units include those illustrated in Table B (FIG. 30B) in U.S. Utility patent application Ser. No. 14/426,467, filed on Mar. 6, 2015, by Hsing-Rong Tseng, Lei Ying, Ben B. Y. Hsu, Christopher J. Takacs, and Guillermo C. Bazan, entitled "FIELD-EFFECT TRANSISTORS BASED ON MACROSCOPICALLY ORIENTED POLYMERS."

For example, the dithiophene unit can comprise:

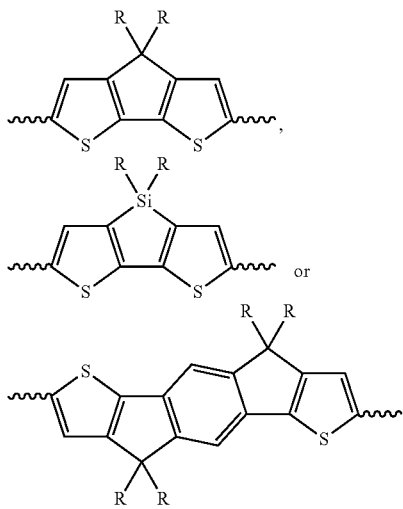

In this way, the acceptor in the semiconducting polymers can comprise the pyridine unit, and the donor in the semiconducting polymers can comprise the dithiophene unit.

One of skill in the art understands that such polymers are prepared/fabricated using the methods described in U.S. Utility patent application Ser. No. 13/526,371, filed on Jun. 18, 2012, by G. Bazan, L. Ying, B. Hsu, W. Wen, H-R Tseng, and G. Welch entitled "REGIOREGULAR PYRIDAL[2,1,3]THIADIAZOLE PI-CONJUGATED COPOLYMERS FOR ORGANIC SEMICONDUCTORS", which application is cross-referenced above and referred to hereafter as the '371 application. According to one example in the '371 application, semiconducting polymers are fabricated using a method comprising reacting pyridal[2,1,3]thiadiazole with an organotin-functionalized cyclopenta[2,1-b:3,4-b']dithiophene or organotin-functionalized indaceno[1,2-b:5,6-b']dithiophene.

Other examples of semiconducting polymers include the derivative (e.g., PCDTFBT) where the N in the pyridine is changed to a C—F functionality (where C is Carbon and F is Fluorine) with the polymer structure shown below:

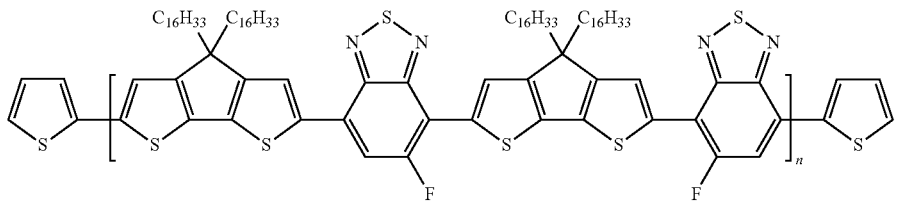

One of skill in the art understands that such polymers are also prepared/fabricated using the methods described in the '371 application cross-referenced above. More specifically, one of skill in the art would understand that the PCDTFBT polymer can be prepared by reacting a halogen-functionalized fluorobenzo[2,1,3]thiadizaole (instead of the pyridal[2,1,3]thiadiazole) in the Stille reaction with the organotin-functionalized cyclopenta[2,1-b:3,4-b']dithiophene or organotin-functionalized indaceno[1,2-b:5,6-b']dithiophene.

In one or more embodiments, PCDTFBT is fabricated using the methods described in reference [30] and U.S. Provisional Patent Application No. 62/253,975, filed Nov. 11, 2015, by Ming Wang and Guillermo Bazan, entitled "FLUORINE SUBSTITUTION INFLUENCE ON BENZO[2,1,3]THIODIAZOLE BASED POLYMERS FOR FIELD-EFFECT TRANSISTOR APPLICATIONS."

Further examples of structures are illustrated in Table 1 of the '371 application.

For example, the semiconducting polymers can comprise a (e.g., regioregular) conjugated main chain section, the conjugated main chain section having a repeat unit that comprises a compound of the structure:

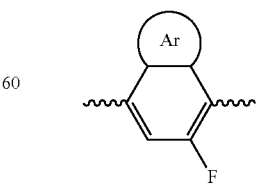

wherein Ar is a substituted or non-substituted aromatic functional group or Ar is nothing and the valence of the ring comprising fluorine (F) is completed with hydrogen. In one or more embodiments, the ring comprising F is regioregularly arranged along the conjugated main chain section.

In one example, the ring comprising the fluorine has the structure:

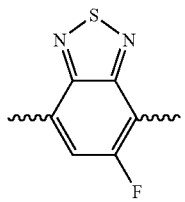

Thus, in one or more embodiments, the semiconducting polymer is a regioregular semiconducting polymer comprising a repeating unit of the structure:

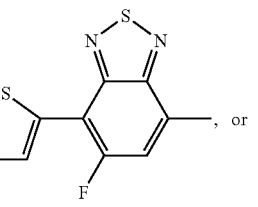, or

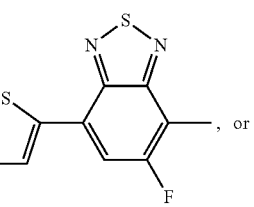, or

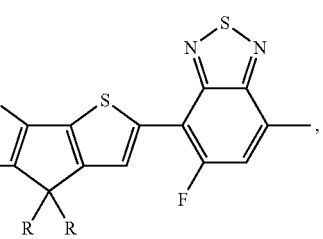, where the ring comprising F is regioregularly arranged along the conjugated main chain section pointing toward the direction shown in the structures above, the R groups comprising the substituted or non-substituted alkyl, aryl or alkoxy chain can be a $C_6$-$C_{30}$ substituted or non-substituted alkyl or alkoxy chain, —$(CH_2CH_2O)n$ (n=2~20), $C_6H_5$, —$C_nF_{(2n+1)}$ (n=2~20), —$(CH_2)_nN(CH_3)_3Br$ (n=2~20), 2-ethylhexyl, $PhC_mH_{2m+1}$ (m=1-20), —$(CH_2)_nN(C_2H_5)_2$ (n=2~20), —$(CH_2)_nSi(C_mH_{2m+1})_3$ (m, n=1 to 20), or —$(CH_2)_nSi(OSi(C_mH_{2m+1})_3)_x(C_pH_{2p+1})_y$ (m, n, p=1 to 20, x+y=3).

In typical embodiments of the invention, the semiconducting polymers comprise a regioregular conjugated main chain section having n=5-5000 (n is an integer) or more contiguous repeat units (e.g., having the alternating structure D-A-D-A, [D-A]$_n$, or [D-A-D-A]$_n$, where D is a donor unit and A is an acceptor unit). In some embodiments, the number of repeat units is in the range of 10-100 repeats. The regioregularity of the conjugated main chain section can be 95% or greater, for example.

Further additives or compositions may be added to the solution, e.g., to form a blend.

Block 508 represents solution casting/processing the solution comprising the semiconducting polymers, such that the semiconducting polymers are deposited in a film on or above the substrate or on the dielectric.

Solution casting methods include, but are not limited to, inkjet printing, bar coating, spin coating, blade coating, spray coating, roll coating, dip coating, free span coating, dye coating, screen printing, and drop casting.

Block 510 represents further processing the polymer blend/film cast on the patterned dielectric layers. The step can comprise annealing/curing/drying the polymer blend (or allowing the polymer blend to dry). The step can comprise depositing source and drain contacts, if necessary.

Block 512 represents optionally chemically treating, doping (e.g., p-type doping), and/or charge compensating the semiconducting polymers.

In one or more embodiments, the treating includes a chemical treatment that adjust/controls carrier density, carrier mobility, a threshold voltage, and/or contact resistance of the OFET.

In one or more embodiments, the chemical treatment includes exposing the semiconductor polymers to a vapor, fluid, gas, and/or composition (e.g., comprising one or more elements, compounds, ions, molecules) having a flow rate and/or flow duration.

In one or more embodiments, the chemical treatment/doping comprises exposing the channel to iodine (e.g., $I_2$ vapor).

In one or more embodiments, the chemical treatment/charge compensation comprises exposing the channel to an amine or a compound comprising hydrogen and nitrogen (e.g., $NH_4OH$, or $RNH_2$, where R is hydrogen or an organic compound).

The treating can further comprise annealing the semiconductor polymers prior to and/or after the exposure of the semiconducting polymers to the chemical treatment. For example, the treating can comprise annealing the OFET; exposing the OFET to $I_2$ vapor; and annealing the OFET after the exposing of the OFET to the $I_2$ vapor.

Block 514 represents the end result, a device such as an OFET. The OFET can comprise a channel/active region on or above the substrate, the channel comprising the semiconducting polymers; a source contact and a drain contact to the semiconducting polymers; and a gate dielectric between a gate and the semiconducting polymers, wherein the gate applies a field to the semiconducting polymers across the dielectric to modulate conduction along a backbone of the semiconducting polymers in the channel between the source contact and the drain contact.

Embodiments of the present invention are not limited to the particular sequence of depositing the source, drain, and gate contacts. For example, OFETs according to one or more embodiments of the present invention can be fabricated in a bottom gate & top contact geometry, bottom gate & bottom contact geometry, top gate & bottom contact geometry, and top gate & top contact geometry [31].

In one or more embodiments, the OFET can comprise means (e.g., nanogrooves or statutory equivalents thereof) for aligning the main chain axes to the channel. In one or more embodiments, alignment is such that conduction between the source contact and the drain contact is predominantly along the backbones/main chain axes, although charge hopping between adjacent polymers in a fiber bundle is also possible. For example, the means can align the main chain axes to an imaginary line bounded by the source and the drain or the means can align the main chain axes to an alignment direction in the channel (see also U.S. Utility application Ser. No. 15/213,029 filed on Jul. 18, 2016 by Byoung Hoon Lee and Alan J. Heeger, entitled "FLEXIBLE ORGANIC TRANSISTORS WITH CONTROLLED NANOMORPHOLOGY", for further information).

In other embodiments, means for aligning the semiconducting polymers comprises a fabrication method, including, but not limited to, blade coating, dip coating, and bar coating (or statutory equivalents thereof) of the semiconducting polymers on dielectric/substrate.

The semiconducting polymers can be fabricated as active regions in devices other than OFETs, such as in an organic light emitting device or in a photovoltaic cell.

The fabrication of the OFET, including selection of a composition of the semiconducting polymers, selection of the treating/doping conditions (e.g., including specific composition, flow rate, flow duration, concentration, temperature, pressure, of the fluid, gas, vapor used for the treating), and/or selection of the annealing conditions (e.g., time and/or temperature) is such that:

the threshold voltage is controlled (e.g., threshold voltage can be shifted to a more positive bias or in a negative bias direction);

the threshold voltage is equal to zero or shifted back towards zero;

variability of the threshold voltage is reduced;

linearity of the OFET's current-voltage (IV) curve is increased (or kinks in the IV curve are reduced after the treatment, such that the OFET is characterized by a linear, ohmic, and non-kinked (IV) current voltage curve, for voltages applied between the source and the drain in a range of 0 and +/−5 V or for voltages applied in a linear (non-saturated) regime.

channel resistance $R_S/W$ is not significantly affected by the treating, i.e., the channel's resistance, defined as $R_S/W$, is unchanged or is not changed to e.g., within 2% or within 4% as compared to before the doping/treating, where $R_S$ is the channel's series or sheet resistance and W is the channel's width;

the contact resistance is minimized or reduced (e.g., by a factor of at least two or from more than 12 k$\Omega$ to less than 12 k$\Omega$);

a carrier mobility (e.g., hole or electron) mobility of the OFET is at least 40.4 $cm^2$ $V^{-1}s^{-1}$ in a saturation regime and at least 10 $cm^2$ $V^{-1}s^{-1}$ in a linear regime;

a carrier mobility (e.g., hole or electron) mobility of the OFET is increased to at least 58.6 $cm^2$ $V^{-1}s^{-1}$ in a saturation regime and at least 18.1 $cm^2$ $V^{-1}s^{-1}$ in a linear regime (e.g., hole and/or electron mobility in a range of 18.1 $cm^2$ $V^{-1}s^{-1}$-200 $cm^2$ $V^{-1}s^{-1}$, e.g., for a source drain voltage in a range of −80 V to 1 V and a gate-source voltage in a range of +20 V to −80 V, or for a gate-source voltage in a range of −20 V to −40 V at a source-drain voltage of −80V), e.g., to obtain a high mobility field effect transistor;

the threshold voltage is shifted from a positive value towards zero while the carrier mobility is reduced by at most 27%;

a ratio $\mu_{lin}/\mu$ is increased (e.g., to at least 0.3 or into a range of 0.1-1), where $\mu_{lin}$ is mobility in the channel in the linear regime and $\mu$ is a mobility in the channel in a saturation regime (e.g., for the channel having a length of less than 50 micrometers and preferably less than 20 micrometers);

an on/off ratio for the OFET of at least $10^4$;

an on/off ratio is increased by at least 8.6% or at least 27% after the chemical treatment;

the semiconducting polymer is oxidized (e.g., the Nitrogen in the pyridine unit is oxidized);

the effect of undesired dopants (e.g., oxygen and/or water) on the OFET's performance is reduced;

the semiconducting polymers are de-doped or charge compensated (e.g., by exposure to a compound having an amine functionality); and/or interfaces between the contacts, comprising metal, and the semiconducting polymers are doped or charge is injected at the interfaces.

The annealing can be at a temperature, or under conditions (e.g., time duration) that de-dopes the channel while doping remains at the interfaces between the metal contacts and the semiconducting polymers. For example, the annealing can be such that hysteresis of the OFET's transfer curve is reduced and the channel's mobility is increased, while the threshold voltage is not changed to within 1%.

The amount of doping by the treating (e.g., iodine doping) can be modest or light (i.e., not heavy doping) while still modifying transistor properties. Since the doping effect depends on both polymer and the dopant, the doping concentration associated with/defining "modest" or "light" doping may vary depending on the dopant and polymer. For example, the amount of doping by the treating can be such that:

absorption of the semiconducting polymers at a wavelength of 1100 nm does not increase by more than 1% (or increases by less than 0.5%) as compared to without the doping/exposing (and/or normalized absorption at wavelengths between 1600 nm and 1900 nm is 0.01 or less);

less than 5% of the monomers in the semiconducting polymers are doped;

less than 1% of the monomers in the semiconducting polymers are doped;

less than 0.2% of the (e.g., PCDTPT) monomers in the semiconducting polymers are doped (defined as "light doping" in one or more embodiments of the invention);

a doping concentration of 0.2%-1% of the (e.g., PCDTPT) monomers is achieved (defined a "modest" doping in one or more embodiments of the invention); and/or the carrier density in the channel is increased from at least $10^{11}$ cm$^{-3}$ to no more than $1 \times 10^{12}$ cm$^{-2}$.

Thus, it is unexpectedly found that chemical treatment (including doping and/or charge compensation) of the donor-acceptor semiconducting polymers in the channel, at interfaces with the source and drain contacts, significantly reduces contact resistance (e.g., by a factor of 2), shifts (e.g., by at least 5 volts) threshold voltage closer to zero volts while not significantly decreasing mobility of the channel, increases alignment of the semiconducting polymers, and/or reduces performance variability of the OFET, while the OFET's on/off ratio stays the same or is increased (e.g., by at least 10%). The present invention's chemical treatment/ doping of the semiconducting polymers is unexpected and surprising at least because previous doping of OFETs/ OTFTs with other types of dopants and conventional methods has been found to undesirably increase the off-current, and reduce on/off ratio. Moreover, one or more embodiments of the present invention have unexpectedly and surprisingly found that doping can be carefully selected to increase mobility while maintaining threshold voltage close to zero.

OFETs according to one or more embodiments of the present invention can be characterized by one or more of the above identified performance metrics. For example, an OFET having a channel length of less than 50 micrometers can exhibit an on/off ratio of at least 10000 and a carrier mobility of at least 40 cm$^2$ V$^{-1}$s$^{-1}$ or at least 58.6 cm$^2$ V$^{-1}$s$^{-1}$ in a saturation regime. For example, an OFET can have a carrier mobility of at least 18.1 cm$^2$ V$^{-1}$s$^{-1}$ in a linear regime and a threshold voltage within +/−0.5 V of 0 Volts (e.g., equal to zero volts).

Advantages and Improvements

One or more embodiments of the present invention have found that with a gradual increase in doping concentration, carrier density and mobility are increased as a result of reduced contact resistance, and the threshold voltage is shifted into the positive bias regime. These results, combined with high mobility and mechanical flexibility of aligned PCDTPT, demonstrate the utility of solution-processed plastic transistors for use in high-performance flexible plastic electronics and electronic circuits.

While heavy iodine doping has been used to increase conductivity of conjugated polymers, one or more embodiments of the present invention have shown the surprising result that modest or light iodine doping and/or ammonia can be used to modify transistor properties in extremely beneficial ways.

In one or more embodiments of the invention, doping of the PCDTPT OFET/OTFT with I$_2$ and/or an amine compound does not increase channel conductivity, while still providing low off-current and high on-off ratio (with little change or an increase in on-off ratio). For example, the inventors measured an on/off ratio of 10031 for the OFET comprising ammonia-treated PCDTPT, an on/off ratio of 9233 for the OFET comprising pristine PCDTPT, and an on/off ratio of 11842 for the OFET comprising iodine-treated PCDTPT. Doping while slightly changing or increasing on/off ratio is a major advantage and a surprising achievement of one or more embodiments of the invention (doping of OFETs/OTFTs with other types of dopants and conventional methods, on the other hand, tends to increase channel conductivity, increase the off-current, and reduce on/off ratio).

In one or more embodiments, ammonia is the active molecule used for de-doping (charge compensation) of the semiconducting polymer, wherein the exposure to the ammonia moves the positive threshold voltage (V$_t$) back to zero, while (surprisingly) not dramatically decreasing the transistor mobility. However, other compounds containing amine functionality (such as RNH$_2$, where R is alkyl, aryl, etc.) can also be used.

Further information on one or more embodiments of the present invention can be found in [32].

REFERENCES

The following references are incorporated by reference herein.

[1] *Organic Field-Effect Transistors*, CRC Press, 2007.

[2] *Large Area and Flexible Electronics*, John Wiley & Sons, 2015.

[3] D. Braga, G. Horowitz, *Adv. Mater.* 2009, 21, 1473.

[4] C. Luo, A. K. K. Kyaw, L. A. Perez, S. Patel, M. Wang, B. Grimm, G. C. Bazan, E. J. Kramer, A. J. Heeger, *Nano Lett.* 2014, 14, 2764.

[5] S. Kobayashi, T. Nishikawa, T. Takenobu, S. Mori, T. Shimoda, T. Mitani, H. Shimotani, N. Yoshimoto, S. Ogawa, Y. Iwasa, *Nat. Mater.* 2004, 3, 317.

[6] G. Lu, J. Blakesley, S. Himmelberger, P. Pingel, J. Frisch, I. Lieberwirth, I. Salzmann, M. Oehzelt, R. Di Pietro, A. Salleo, N. Koch, D. Neher, *Nat Commun* 2013, 4, 1588.

[7] B. Lüssem, M. L. Tietze, H. Kleemann, C. Hoβbach, J. W. Bartha, A. Zakhidov, K. Leo, *Nat Commun* 2013, 4.

[8] K. P. Pernstich, S. Haas, D. Oberhoff, C. Goldmann, D. J. Gundlach, B. Batlogg, A. N. Rashid, G. Schitter, *J Appl. Phys.* 2004, 96, 6431.

[9] J. H. Kim, S. W. Yun, B.-K. An, Y. D. Han, S.-J. Yoon, J. Joo, S. Y. Park, *Adv. Mater.* 2013, 25, 719.

[10] B. Lüssem, M. L. Tietze, H. Kleemann, C. Hoβbach, J. W. Bartha, A. Zakhidov, K. Leo, *Nat Commun* 2013, 4, 2775.

[11] H.-R. Tseng, H. Phan, C. Luo, M. Wang, L. A. Perez, S. N. Patel, L. Ying, E. J. Kramer, T.-Q. Nguyen, G. C. Bazan, A. J. Heeger, *Adv. Mater.* 2014, 26, 2993.

[12] G. Kim, S.-J. Kang, G. K. Dutta, Y.-K. Han, T. J. Shin, Y.-Y. Noh, C. Yang, *J. Am. Chem. Soc.* 2014, 136, 9477.

[13] H.-R. Tseng, L. Ying, B. B. Y. Hsu, L. A. Perez, C. J. Takacs, G. C. Bazan, A. J. Heeger, *Nano Lett.* 2012, 12, 6353.

[14] B. H. Lee, S. H. Park, H. Back, K. Lee, *Adv. Funct. Mater.* 2011, 21, 487.

[15] C. K. Chiang, C. R. Fincher, Y. W. Park, A. J. Heeger, H. Shirakawa, E. J. Louis, S. C. Gau, A. G. MacDiarmid, *Phys. Rev. Lett.* 1977, 39, 1098.

[16] V. V. Kislyuk, O. P. Dimitriev, A. A. Pud, J. Lautru, I. Ledoux-Rak, *Journal of Physics: Conference Series* 2011, 286, 012009.

[17] J. Wang, *Polym. Degrad. Stab.* 2005, 89, 15.

[18] J. Hwang, I. Schwendeman, B. C. Ihas, R. J. Clark, M. Cornick, M. Nikolou, A. Argun, J. R. Reynolds, D. B. Tanner, *Phys. Rev. B* 2011, 83, 195121.

[19] L. Ying, B. B. Y. Hsu, H. Zhan, G. C. Welch, P. Zalar, L. A. Perez, E. J. Kramer, T.-Q. Nguyen, A. J. Heeger, W.-Y. Wong, G. C. Bazan, *J. Am. Chem. Soc.* 2011, 133, 18538.

[20] H. Gilles, in *Organic Field-Effect Transistors*, CRC Press, 2007, 73.

[21] M. Marinkovic, D. Belaineh, V. Wagner, D. Knipp, *Adv. Mater.* 2012, 24, 4005.

[22] S. Cho, J. H. Seo, K. Lee, A. J. Heeger, *Adv. Funct. Mater.* 2009, 19, 1459.

[23] S. Schaur, P. Stadler, B. Meana-Esteban, H. Neugebauer, N. Serdar Sariciftci, *Org. Electron.* 2012, 13, 1296.

[24] M. S. A. Abdou, F. P. Orfino, Y. Son, S. Holdcroft, *J. Am. Chem. Soc.* 1997, 119, 4518.

[25] J. Zaumseil, K. W. Baldwin, J. A. Rogers, *J. Appl. Phys.* 2003, 93, 6117.

[26] <http://www.lasurface.com/database/elementxps.php>.

[27] T. S. van der Poll, J. A. Love, T.-Q. Nguyen, G. C. Bazan, *Adv. Mater.* 2012, 24, 3646.

[28] G. Kalita, K. Wakita, M. Takahashi, M. Umeno, *J. Mater. Chem.* 2011, 21, 15209.

[29] "Supporting Information, Doping-induced carrier density modulation in polymer field effect transistors," by Byoung Hoon Lee, Guillermo C. Bazan, and Alan J. Heeger.

[30] "Fluorine substitution influence on benzo[2,1,3]thiadiazole based polymers for field-effect transistor applications," by Ming Wang, Michael Ford, Hung Phan, Jessica Coughlin, Thuc-Quyen Nguyen and Guillermo C. Bazan *Chem. Commun.*, 2016,52, 3207-3210DOI: 10.1039/C5CC10009G.

[31] DiBenedetto et. al., Molecular Self-Assembled Monolayers and Multilayers for Organic and Unconventional Inorganic Thin-Film Transistor Applications, Adv. Mater. 2009, 21, 1407-1433 DOI 10.1002/adma.200803267.

[32] Doping-Induced Carrier Density Modulation in Polymer Field-Effect Transistors, by Byoung Hoon Lee, Guillermo Bazan, and Alan J. Heeger, *Adv. Mater.* 2016, 28, 57-62 (supporting information found in [29]).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

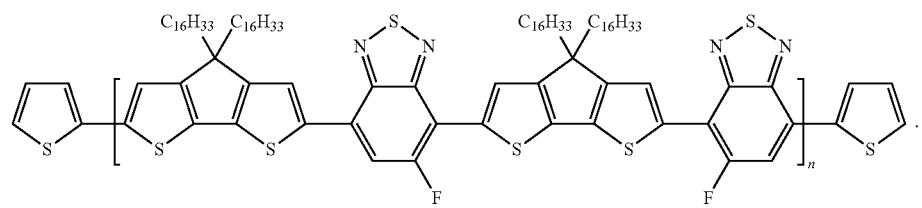

29. The OFET of claim 23, wherein the semiconducting polymer has the repeating unit of the structure:
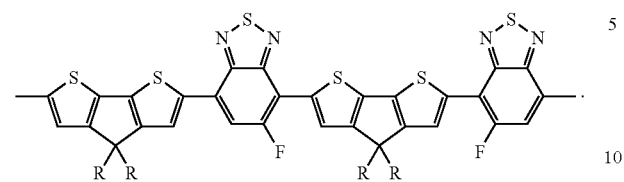

What is claimed is:

1. A method of fabricating an organic field effect transistor (OFET), comprising:
   forming a source contact and a drain contact to a channel comprising semiconducting polymers;
   providing a dielectric between the semiconducting polymers and a gate;
   doping the semiconducting polymers that interface with the source contact;
   doping the semiconducting polymers that interface with the drain contact; and
   wherein the doping of the semiconducting polymers that interface with the source contact and the doping of the semiconducting polymers that interface with the drain contact dopes the semiconducting polymers with one or more doping concentrations that:
   increase linearity of the OFET's current-voltage (IV) curve, for voltages applied between the source contact and the drain contact in a range of 0 and +/−5 V, and do not change the channel's resistance, defined as Rs/W, to within 4% as compared to before the doping, where Rs is the channel's series resistance and W is the channel's width.

2. The method of claim 1, further comprising charge compensating the semiconducting polymers.

3. The method of claim 1, wherein the doping concentrations are such that 1% or less than 1% of monomers in the semiconducting polymers are doped.

4. The method of claim 1, wherein the doping concentrations are such that:
   the OFET has a threshold voltage within +/−2 Volts of 0 Volts,
   the OFET's on/off ratio remains the same or is increased as compared to without the doping,
   the OFET's off current remains the same or is decreased as compared to without the doping, and
   the OFET's contact resistance is reduced by at least a factor of two as compared to without the doping.

5. The method of claim 1, wherein the doping concentrations are characterized by an increase in absorption of the channel, at a wavelength in a range of 800 nm-1100 nm, of less than 0.5% as compared to without the doping.

6. The method of claim 1, wherein the doping increases the channel's carrier mobility to at least 58.6 $cm^2V^{-1}s^{-1}$ in a saturation regime and at least 18.1 $cm^2 V^{-1}s^{-1}$ in a linear regime.

7. The method of claim 1, further comprising annealing the semiconductor polymers, wherein the annealing is such that hysteresis of the OFET's transfer curve is reduced and the channel's mobility is increased, while the OFET's threshold voltage is not changed to within 1%.

8. The method of claim 1, wherein:
   the doping of the semiconducting polymers that interface with the source contact comprises oxidizing the semiconducting polymers that interface with the source contact, and
   the doping of the semiconducting polymers that interface with the drain compact comprises oxidizing the semiconducting polymers that interface with the drain contact.

9. The method of claim 1, wherein doping comprises exposing the OFET to $I_2$ vapor and further comprising annealing the OFET after the exposing.

10. The method of claim 1, further comprising treating the semiconducting polymers that interface with the source contact and the semiconducting polymers that interface with the drain contact, wherein the treating is with an amine.

11. The method of claim 1, further comprising treating the semiconducting polymers that interface with the source contact and the semiconducting polymers that interface with the drain contact, wherein the treating is with $NH_4OH$.

12. The method of claim 1, further comprising treating the semiconducting polymers that interface with the source contact and the semiconducting polymers that interface with the drain contact, wherein the treating is with $RNH_2$, where R is hydrogen or an organic compound.

13. The method of claim 1, wherein semiconducting polymer comprises a regioregular conjugated main chain section, said regioregular conjugated main chain section having a repeat unit that comprises the structure:

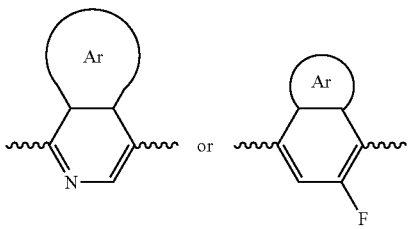

wherein Ar is a substituted or non-substituted aromatic functional group, or Ar is nothing and the valence of the pyridine ring is completed with hydrogen or the valence of the fluorobenzene ring is completed with hydrogen.

14. The method of claim 13, wherein:
the pyridine unit comprises:

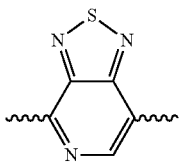

or
the fluorinated unit comprises:

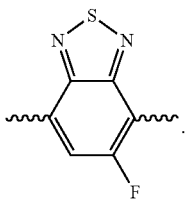

15. The method of claim 14, wherein the repeat unit further comprises a dithiophene of the structure:

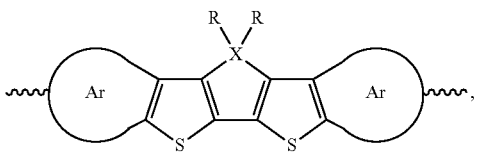

wherein each Ar is independently a substituted or non-substituted aromatic functional group, or each Ar is independently nothing and the valence of its respective thiophene ring is completed with hydrogen, each R is independently hydrogen or a substituted or non-substituted alkyl, aryl or alkoxy chain; and X is C, Si, Ge, N or P.

16. The method of claim 1, wherein the semiconducting polymers comprise PCDTFBT.

17. An organic field effect transistor (OFET), comprising:
a channel comprising semiconducting polymers, the semiconducting polymers comprising one or more doped semiconducting polymers having one or more doping concentrations;
a source contact to one or more of the doped semiconducting polymers;
a drain contact to one or more of the doped semiconducting polymers; and
a dielectric between the channel and a gate; and
wherein the doping concentrations:
increase linearity of the OFET's current-voltage (IV) curve, for voltages applied between the source contact and the drain contact in a range of 0 and +/−5 V, and
do not change the channel's resistance, defined as $R_s/W$, to within 4% as compared to before the doping, where $R_s$ is the channel's series resistance and W is the channel's width.

18. The OFET of claim 17, wherein channel comprises an amine and iodine.

19. The OFET of claim 17, wherein the channel further comprises charge compensating the semiconducting polymers and the one or more doping concentrations are such that 1% or less than 1% of monomers in the semiconducting polymers are doped.

20. The OFET of claim 17, wherein the one or more doping concentrations are such that:
the OFET has a threshold voltage within +/−2 Volts of 0 Volts,
the OFET's on/off ratio remains the same or is increased as compared to without the doping,
the OFET's off current remains the same or is decreased as compared to without the doping, and
the OFET's contact resistance is reduced by at least a factor of two as compared to without the doping.

21. The OFET of claim 17, wherein:
the one or more doping concentrations are characterized by an increase in absorption of the channel, at a wavelength in a range of 800 nm-1100 nm, of less than 0.5% as compared to without the doping, and/or
the doping increases the channel's carrier mobility to at least 58.6 $cm^2V^{-1}s^{-1}$ in a saturation regime and at least 18.1 $cm^2V^{-1}s^{-1}$ in a linear regime.

22. The OFET of claim 17, wherein the semiconducting polymers that interface with the source contact and the semiconducting polymers that interface with the drain contact are oxidized.

23. An organic field effect transistor (OFET), comprising:
a channel comprising a semiconducting polymer, wherein the semiconducting polymer has a repeating unit of the structure:

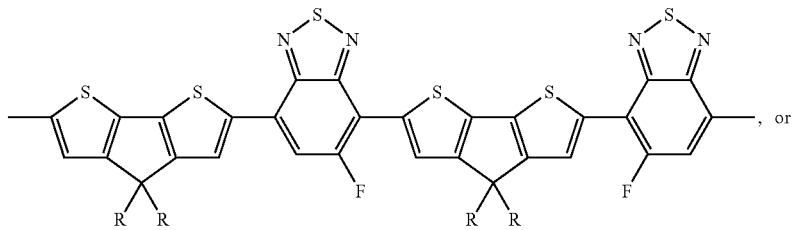

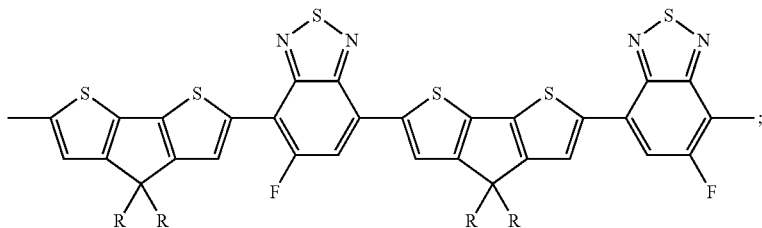

and
- wherein the fluorine (F) is regioregularly arranged along the semiconducting polymer's conjugated main chain section; and
- wherein the R are each independently an alkyl, aryl, or an alkoxy chain;
- a source contact to the channel;
- a drain contact to the channel; and
- a gate contact on or above the channel; and
- end capping on both ends of the semiconducting polymer.

24. The OFET of claim 23, wherein the semiconducting polymer has its main chain axis aligned with an alignment direction in the channel pointing from the source contact to the drain contact, so that charge transport between the source contact and the drain contact is preferentially along the semiconducting polymer's backbone and in the alignment direction.

25. The OFET of claim 24, wherein the channel has a carrier mobility of at least 58.6 cm$^2$ V$^{-1}$s$^{-1}$.

26. The OFET of claim 23, wherein the semiconducting polymer comprises PCDTFBT having the following structure:

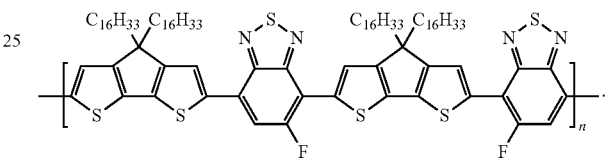

and wherein n is greater than 6.

27. The OFET of claim 23, wherein the semiconducting polymer comprises PCDTFBT having the following structure:

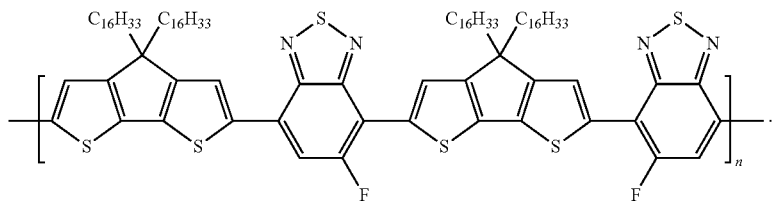

28. The OFET of claim 23, wherein the semiconducting polymer comprises PCDTFBT having the following structure: